(12) United States Patent
Rada et al.

(10) Patent No.: US 9,048,943 B2
(45) Date of Patent: Jun. 2, 2015

(54) LOW-POWER, NOISE INSENSITIVE COMMUNICATION CHANNEL USING LOGARITHMIC DETECTOR AMPLIFIER (LDA) DEMODULATOR

(71) Applicant: Dockon AG, San Diego, CA (US)

(72) Inventors: Patrick Rada, San Diego, CA (US); Forrest Brown, Carson City, NV (US)

(73) Assignee: DockOn AG, San Diego, CA (US)

( * ) Notice: Subject to any disclaimer, the term of this patent is extended or adjusted under 35 U.S.C. 154(b) by 0 days.

(21) Appl. No.: 14/210,525

(22) Filed: Mar. 14, 2014

(65) Prior Publication Data

US 2014/0269972 A1 Sep. 18, 2014

Related U.S. Application Data

(60) Provisional application No. 61/789,829, filed on Mar. 15, 2013, provisional application No. 61/798,521, filed on Mar. 15, 2013.

(51) Int. Cl.
*H04B 3/00* (2006.01)
*H04B 15/00* (2006.01)
(Continued)

(52) U.S. Cl.
CPC ........ *H04B 15/00* (2013.01); *H04B 3/02* (2013.01); *H04B 1/10* (2013.01)

(58) Field of Classification Search
CPC ........... H04L 25/0272; A61N 1/37252; G01R 31/013
USPC ............................. 375/257; 702/69; 607/60
See application file for complete search history.

(56) References Cited

U.S. PATENT DOCUMENTS

| 2,363,651 A | 11/1944 | Crosby |
| 2,644,081 A | 6/1953 | Donald |

(Continued)

FOREIGN PATENT DOCUMENTS

| EP | 1384281 A2 | 1/2004 |
| GB | 2354329 A | 3/2001 |

(Continued)

OTHER PUBLICATIONS

U.S. Appl. No. 14/213,529, filed Mar. 14, 2014, Rada et al.

(Continued)

*Primary Examiner* — Daniel Washburn
*Assistant Examiner* — Fitwi Hailegiorgis
(74) *Attorney, Agent, or Firm* — Law Office of Gerald Maliszewski; Gerald Maliszewski

(57) ABSTRACT

A method is provided for communicating signals at a low power level in an electromagnetic interference (EMI) environment. A first device transmits a modulated signal having a first carrier frequency, including the encoded information via a hardwire transmission medium. In one aspect, the power level of the modulated signal can be adjusted to minimize power consumption or reduce the generation of EMI. The modulated signal may be in one of the following formats: frequency modulation (FM) or phase modulation (PM) to name a few examples. A second device including a logarithmic detector amplifier (LDA) demodulator circuit receives the signal, which may be mixed with EMI. The LDA demodulator circuit amplifies the modulated signal, without amplifying the EMI, to supply a demodulated baseband signal, which may be an n-ary digital signal, or an audio signal. A low-power, noise insensitive communication channel is also provided.

29 Claims, 21 Drawing Sheets

(51) Int. Cl.
*H04B 1/10* (2006.01)
*H04B 3/02* (2006.01)

(56) References Cited

U.S. PATENT DOCUMENTS

| | | | |
|---|---|---|---|
| 3,092,779 A | 6/1963 | De Niet |
| 3,320,530 A | 5/1967 | Pearman |
| 3,337,807 A | 8/1967 | Brown |
| 3,668,535 A | 6/1972 | Lansdowne |
| 3,724,954 A | 4/1973 | Dreyfoos |
| 3,791,272 A | 2/1974 | Nobusawa |
| 4,034,298 A | 7/1977 | McFadyen et al. |
| 4,393,514 A | 7/1983 | Minakuchi et al. |
| 4,609,994 A | 9/1986 | Bassim et al. |
| 4,660,192 A | 4/1987 | Pomatto |
| 1,424,065 A | 7/1992 | Armstrong |
| 5,621,756 A | 4/1997 | Bush et al. |
| 5,771,026 A | 6/1998 | Stengel |
| 5,789,996 A | 8/1998 | Borodulin |
| 6,035,002 A | 3/2000 | Schleifer |
| 6,054,900 A | 4/2000 | Ishida et al. |
| 6,389,275 B1 | 5/2002 | Kawashima et al. |
| 6,420,937 B1 | 7/2002 | Akatsuka et al. |
| 6,421,535 B1 | 7/2002 | Dickerson et al. |
| 6,518,856 B1 | 2/2003 | Casale et al. |
| 6,538,528 B2 | 3/2003 | Louzir et al. |
| 6,574,287 B1 | 6/2003 | Swaminathan et al. |
| 6,668,165 B1 | 12/2003 | Cloutier |
| 6,668,619 B2 | 12/2003 | Yang et al. |
| 6,670,849 B1 | 12/2003 | Damgaard |
| 7,215,936 B2 | 5/2007 | Sadowski |
| 7,423,931 B2 | 9/2008 | Martin et al. |
| 7,567,099 B2 | 7/2009 | Edwards et al. |
| 7,612,616 B2 | 11/2009 | Deng et al. |
| 7,751,996 B1* | 7/2010 | Ardizzone et al. ............ 702/69 |
| 7,819,022 B2 | 10/2010 | Hope |
| 7,848,384 B2 | 12/2010 | Pelissier et al. |
| 7,911,235 B2 | 3/2011 | Brown |
| 8,040,204 B2 | 10/2011 | Brown |
| 8,064,864 B2 | 11/2011 | Rofougaran |
| 8,144,065 B2 | 3/2012 | Brown |
| 8,149,173 B2 | 4/2012 | Brown |
| 8,164,532 B1 | 4/2012 | Brown |
| 8,364,098 B2 | 1/2013 | Ridgers |
| 8,368,485 B2 | 2/2013 | Brown |
| 8,462,031 B2 | 6/2013 | Belot et al. |
| 8,542,768 B2 | 9/2013 | Kim et al. |
| 8,676,521 B2 | 3/2014 | Vennelakanti et al. |
| 2002/0109607 A1 | 8/2002 | Cumeralto et al. |
| 2004/0229585 A1 | 11/2004 | Lu et al. |
| 2004/0240588 A1 | 12/2004 | Miller |
| 2005/0009480 A1 | 1/2005 | Vakilian et al. |
| 2005/0069051 A1 | 3/2005 | Lourens |
| 2005/0270172 A1 | 12/2005 | Bailey et al. |
| 2006/0028297 A1 | 2/2006 | Kang et al. |
| 2006/0226897 A1 | 10/2006 | Ruijter |
| 2007/0030099 A1 | 2/2007 | Carpentier et al. |
| 2007/0066265 A1 | 3/2007 | May |
| 2007/0105521 A1 | 5/2007 | Granata |
| 2007/0139130 A1 | 6/2007 | Kim et al. |
| 2007/0207749 A1 | 9/2007 | Rozenblit et al. |
| 2008/0176529 A1 | 7/2008 | Lau |
| 2008/0269841 A1* | 10/2008 | Grevious et al. ............ 607/60 |
| 2009/0079524 A1 | 3/2009 | Cyr et al. |
| 2009/0079607 A1 | 3/2009 | Denison et al. |
| 2009/0147837 A1 | 6/2009 | Lau |
| 2009/0322544 A1 | 12/2009 | McDowell |
| 2010/0152644 A1 | 6/2010 | Pesach et al. |
| 2010/0225417 A1 | 9/2010 | Mistretta et al. |
| 2010/0313958 A1 | 12/2010 | Patel et al. |
| 2011/0007844 A1 | 1/2011 | Park et al. |
| 2011/0018777 A1 | 1/2011 | Brown |
| 2011/0037516 A1 | 2/2011 | Nejati et al. |
| 2011/0093220 A1 | 4/2011 | Yang et al. |
| 2011/0234316 A1 | 9/2011 | Kim et al. |
| 2011/0301882 A1 | 12/2011 | Andersen |
| 2012/0019336 A1 | 1/2012 | Khan et al. |
| 2012/0106560 A1 | 5/2012 | Gumaste |
| 2012/0112852 A1 | 5/2012 | Manssen et al. |
| 2012/0121030 A1 | 5/2012 | Luo et al. |
| 2012/0164644 A1 | 6/2012 | Neely et al. |
| 2012/0190317 A1 | 7/2012 | Martineau et al. |
| 2012/0280754 A1 | 11/2012 | Gorbachov |
| 2013/0029350 A1 | 1/2013 | Cooper et al. |
| 2013/0059548 A1 | 3/2013 | Umeda et al. |
| 2013/0113666 A1 | 5/2013 | Orsi et al. |
| 2013/0128934 A1 | 5/2013 | Kang et al. |
| 2014/0150554 A1 | 6/2014 | Rada et al. |
| 2014/0154991 A1 | 6/2014 | Brown et al. |
| 2014/0266420 A1 | 9/2014 | Brown et al. |
| 2014/0266962 A1 | 9/2014 | Dupuy et al. |
| 2014/0273898 A1 | 9/2014 | Brown et al. |
| 2014/0287704 A1 | 9/2014 | Dupuy et al. |

FOREIGN PATENT DOCUMENTS

| | | |
|---|---|---|
| JP | 56-138340 A | 10/1981 |
| JP | 56-138342 A | 10/1981 |
| JP | 10-075273 A | 3/1998 |
| WO | WO 00/35124 A2 | 6/2000 |
| WO | WO 02/084782 A2 | 10/2002 |
| WO | WO 2008/075066 A2 | 6/2008 |
| WO | WO 2012/153147 A1 | 11/2012 |

OTHER PUBLICATIONS

U.S. Appl. No. 14/216,945, filed Mar. 17, 2014, Rada et al.
Sanders B.J.; "Radical Combiner Runs Circles Around Hybrids," MicroWaves; Nov. 1980; vol. 19, No. 12; p. 55-58.
Caloz et al.;"Metamaterials for High-Frequency Electronics"; Proceedings of the IEEE; vol. 93; No. 10; Oct. 2005; p. 1744-1752.
Insam; "Designing Super-Regenerative Receivers"; Electronic World; Apr. 2002; 19 pages.
International Patent Application No. PCT/US2014/029832; Int'l Preliminary Report on Patentability; dated Mar. 11, 2015; 7 pages.

* cited by examiner

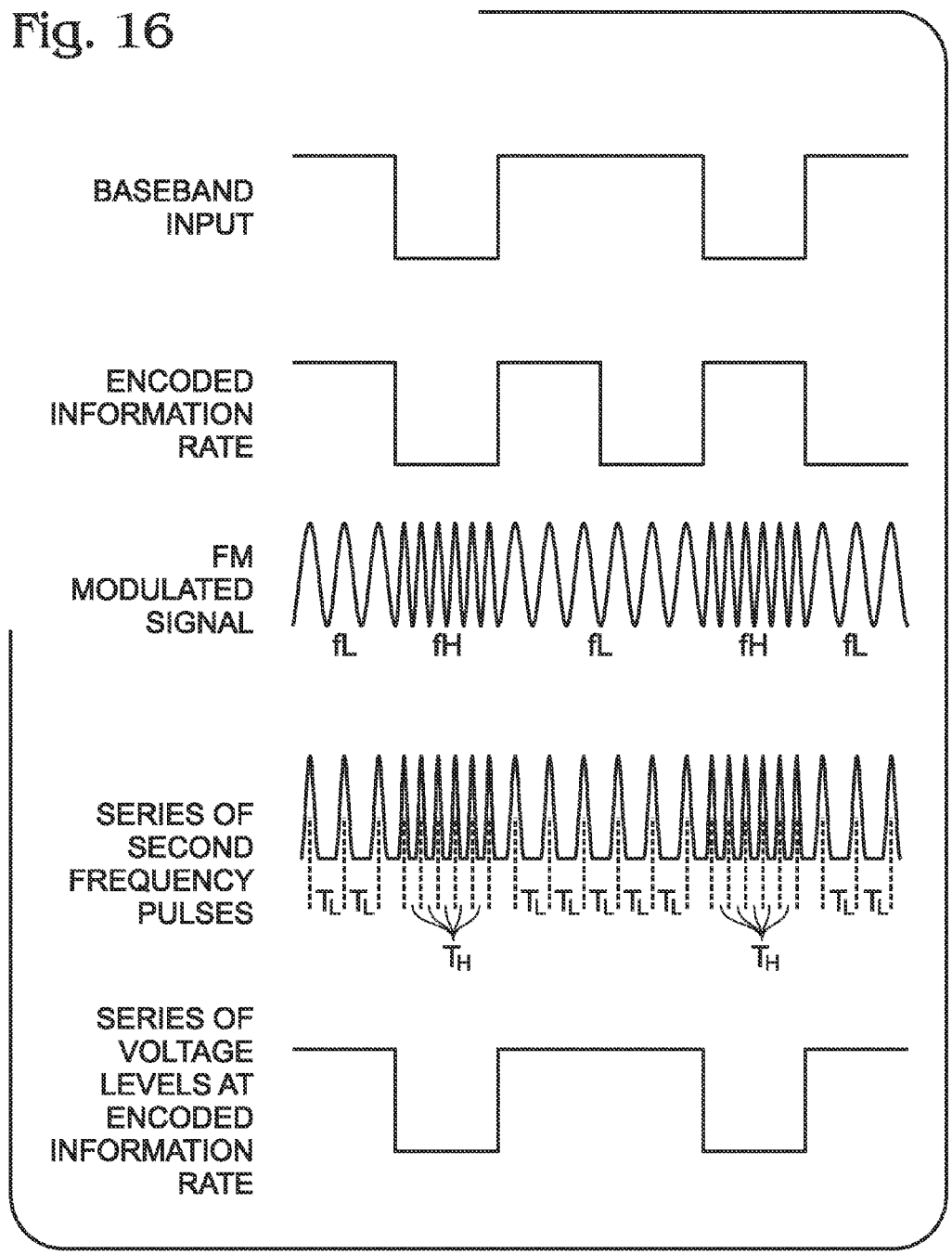

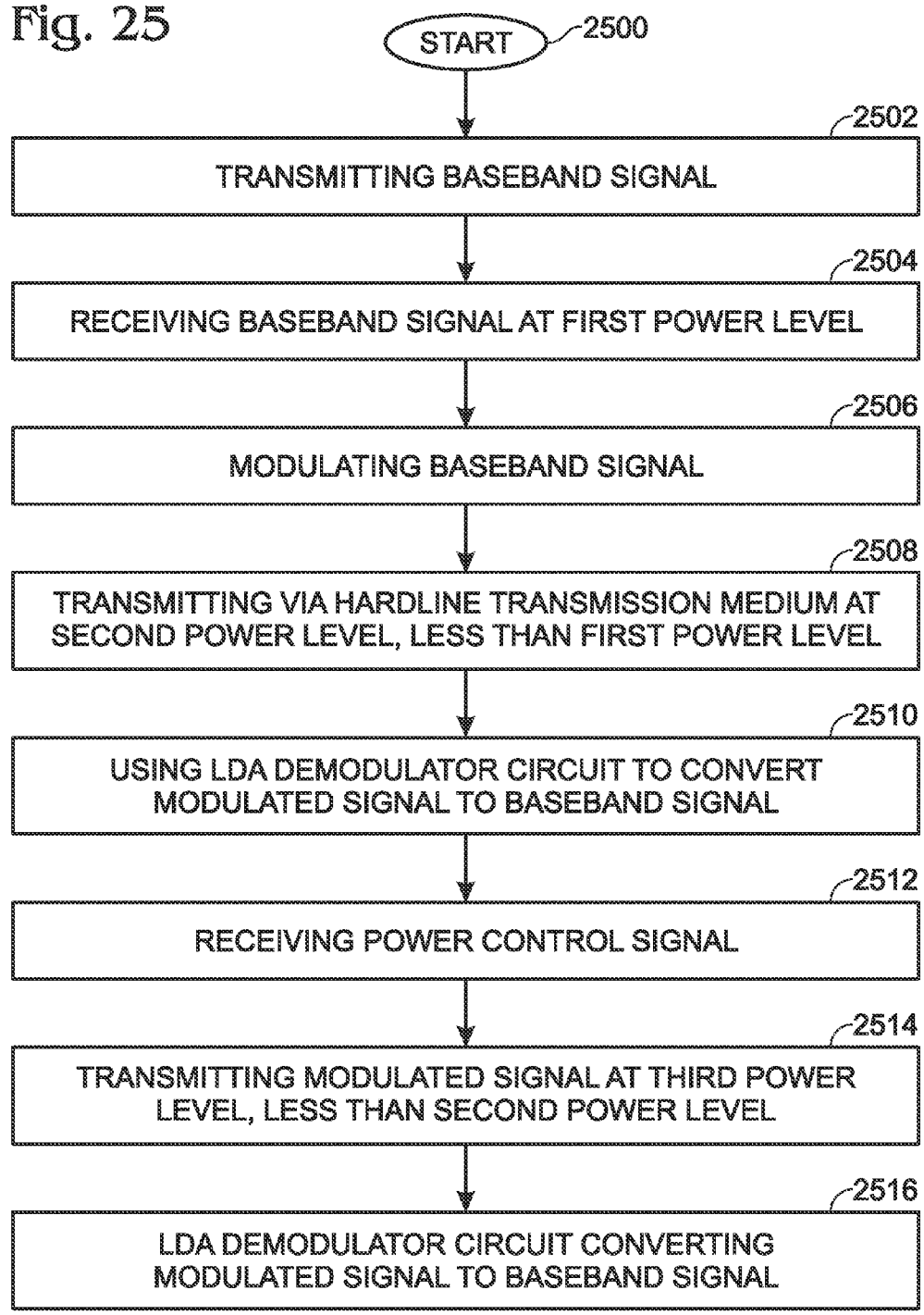

LOW-POWER, NOISE INSENSITIVE COMMUNICATION CHANNEL USING LOGARITHMIC DETECTOR AMPLIFIER (LDA) DEMODULATOR

RELATED APPLICATIONS

This application claims the benefit of a Provisional patent application entitled, FREQUENCY SELECTIVE LOGARITHMIC AMPLIFIER WITH INTRINSIC FREQUENCY DEMODULATION CAPABILITY, invented by Forest Brown et al. Ser. No. 61/789,829, filed Mar. 15, 2013;

This application claims the benefit of a Provisional patent application entitled, LOGARITHMIC AMPLIFIER WITH UNIVERSAL DEMODULATION CAPABILITIES, invented by Forest Brown et al. Ser. No. 61/798,521, filed Mar. 15, 2013. Both these applications are incorporated herein by reference in their entirety.

BACKGROUND OF THE INVENTION

1. Field of the Invention

This invention generally relates to electronic communications and, more particularly, to systems and methods for using a logarithmic detector amplifier (LDA) demodulator circuit to enable low-power, noise insensitive communications.

2. Description of the Related Art

Electronic devices, such as portable smart phones, demand have an ever increasing need for more data to be delivered at faster data rates. However, as the frequencies (clock rates) of the processors and logic circuits in these devices increase, their power consumption likewise increases. At the same time, there is a demand that portable devices be able to operate for more extended periods of time. One approach to addressing the problem of lower power consumption has been the use of multiple processors. For example, processor power consumption in the latest generations of smart phone has been reduced by using a slower processor for voice and text applications, and a faster processor for video applications.

New complex modulation techniques such as 256-quadrature amplitude modulation (QAM) have pushed Wi-Fi speeds up to 1 Gbps for the newest standard, IEEE 802.11ac. However, to achieve an acceptable bit error rate (BER), greater signal-to-noise ratio (SNR) is required, which limits the usable range for high speed data transfer. The same situation exists in the latest fourth generation long term evolution (4G LTE) platform for the cellular industry. SNR dominates the limits of service delivery. It has been estimated that a 3 decibel (dB) SNR improvement would double the average data rate per user, and a 6 dB SNR improvement would corresponds to $74 billion USD incremental earnings for carriers.

Further, these electronic devices contribute to the generation of electromagnetic interference (EMI), and are likewise susceptible to EMI generated by other sources. EMI is mostly a function of the signal power, but also the edge sharpness of the signal. EMI problems can be addressed by controlling the edge of the transitions, and careful decoupling circuits, such as with the use of series resistors in digital lines. However, these signal conditioning methods require additional circuitry, and signal power must necessarily be increased to compensate for component loses, which again increases power consumption.

It would be advantageous if high-speed communications between electronic devices could be conducted using a method that reduces power consumption and increases sensitivity, while being less susceptible to EMI.

It would be advantageous if the above-mentioned high-speed communications could be conducted using a method that generated less EMI to interfere with adjacent circuitry.

SUMMARY OF THE INVENTION

The regenerative selective logarithmic detector amplifiers (LDAs) disclosed herein have similarities to super-regenerative receivers (SRO) in term of circuit topology. However, the LDA is a phase sensitive regeneration detector, while the SRO is an amplitude sensitivity regeneration device. In particular, the LDA has a self-quenching mechanism with low gain that amplifies the signal from the noise floor over a number of cycles. In contrast, the SRO has external quenching and high gain that makes its electrical behaviors and performances quite different. There are also some similarities between the LDA and DC or baseband log amps: both provide logarithmic amplification over a wide dynamic range. Furthermore, the LDA can have an intrinsic capability to demodulate analog or digital FM or AM & FM simultaneously. Examples of LDAs can be found in U.S. Pat. No. 7,911,235, issued to DockOn AG, the contents of which are hereby incorporated by reference in their entirety.

The SRO typically suffers from poor selectivity and higher output noise when used for narrow band signals. SROs also may drift in temperature when the oscillator is LC based. The SRO receiver was quickly replaced by the super-heterodyne receiver for mainstream radio, because the latter has superior selectivity and sensitivity. However, the SRO is simple and low power, and has been used over many decades for remote control systems, short distance telemetry, and wireless security. Selectivity and drift limitations were addressed at the end of the 1980s by the use of SAW devices. In the first decade of the 21st century, articles show a renewed interest in SROs for use in low power receivers up to the GHz range, and for moderate to high data rate applications.

Baseband log amps are based on multiple Gilbert cells, and typically provide a good linearity over a mid to large dynamic range at low to high frequencies. Simpler logarithmic amplifiers (e.g. DC log amps) are based on transistor logarithmic current versus voltage transfer characteristic, and address applications ranging from DC to low frequency.

A method is provided for communicating signals at a low power level in an electromagnetic interference (EMI) environment. A first device is described that transmits a modulated signal having a first carrier frequency, including encoded information, via a hardwire transmission medium. In one aspect, the power level of the modulated signal can be adjusted to minimize power consumption or reduce the generation of EMI. The modulated signal may be in one of the following formats: frequency modulation (FM), phase modulation (PM), Gaussian frequency-shift keying (GFSK), minimum-shift keying (MSK), Gaussian minimum-shift keying (GMSK), pulse width modulation (PWM), or amplitude modulation (AM). The transmission medium may be a trace on a printed circuit board (PCB) or a wire in a wire harness, to name a couple of examples. Because the transmission is modulated, it can be sent at a lower power level than a conventional baseband binary logic digital signal (i.e., a sequence of encoded "1"s and "0"s).

The hardwire transmission medium is typically exposed to an environment comprising EMI, and the EMI is combined with the modulated signal on the hardwire transmission line to create a mixed signal. A second device including a logarithmic detector amplifier (LDA) demodulator circuit receives the mixed signal. The LDA demodulator circuit amplifies the modulated signal, without amplifying the EMI, to supply a demodulated baseband signal, which may be an n-ary logic digital signal or an audio signal.

For example, the first device may transmit an n-frequency-shift keying (n-FSK) modulated FM signal. Then, the second device may supply $\log_2$ (n) streams of baseband binary logic digital signals, or a single digital stream of n logic levels as a result of demodulation. More explicitly, the LDA demodulator circuit converts the modulated signal to a series of second frequency pulses at an encoded information rate. The LDA demodulator circuit includes a frequency-to-voltage converter (FVC) that converts the series of second frequency pulses to a series of voltage levels at the encoded information rate, which may be interpreted as an audio signal or an n-ary logic signal.

Additional details of the above-described method and a low-power, noise insensitive communication channel are provided below.

BRIEF DESCRIPTION OF THE DRAWINGS

FIG. 16 depicts an exemplary communication scenario.

FIG. 25 is a flowchart illustrating a method for communicating signals at low power levels.

DETAILED DESCRIPTION

Figure 1:
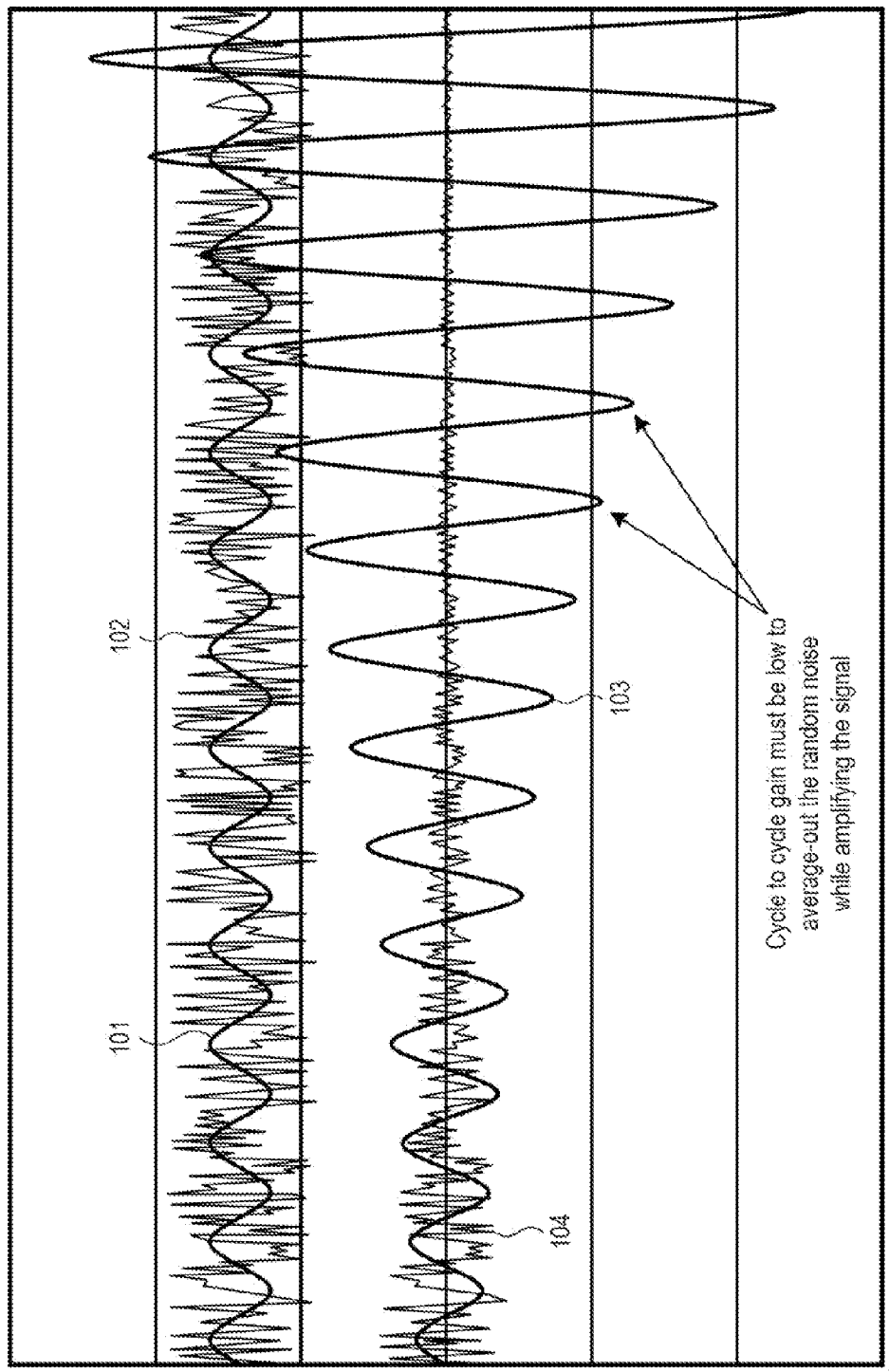
FIG. 1 depicts example input and output signals from an LDA.

The logarithmic detector amplifier (LDA) technology described herein brings significant enhancements to the state of the art super-regenerative oscillators (SROs) and log amps. For examples, LDAs can have intrinsic ability to demodulate frequency with high skirt ratio, very high sensitivity and noise suppression, very high dynamic range, superior discrimination, and flexible placement in a receiver chain without drawback. Table 1 compares various LDA, SRO, and amp technologies with their respective pros and cons.

TABLE 1

Comparison of LDA, SRO, and amp technologies

| Parameters | LDAs | SROs | DC or baseband Log amps |
|---|---|---|---|
| Receive sensitivity @ 1 MHz bandwidth | Very high, on the order of −114 dBm | Medium to high, on the order of −80 dBm to −90 dBm | Medium to high, on the order of −80 dBm to −90 dBm |
| Dynamic range (min. to max. signal level range) | Very high, on the order of 100 dB | Medium, In the order of 20 to 60 dB | High, In the order of 40 to 90 dB |
| Ability to directly demodulate FM | Yes FM, AM & both FM/AM incl. digital modulations | No AM only | No |
| Demodulation discrimination (FM) | Superior, high skirt ratio Up to 4 dB higher than standard discriminators | None | None |
| Reduce Noise | Yes | No | No |
| Noise | Bandwidth dependent, typ. equal to noise power | Maximum noise, min. 6 dB above noise floor to be usable | Maximum noise minus 10 dB, min. 6 dB above noise floor to be usable |
| Placement in receive chain | ANYWHERE without loss of receive sensitivity | ANYWHERE with loss of receive sensitivity (except if upfront) | N.A. |
| Quenching process | Self-quenched leading to very high sensitivity | Externally quenched (or synchronized) | N.A. |

TABLE 1-continued

Comparison of LDA, SRO, and amp technologies

| Parameters | LDAs | SROs | DC or baseband Log amps |
|---|---|---|---|
| Amplification mode | Phase sensitive regeneration | Amplitude sensitive regeneration | multiple amplification |
| Circuit topology | Proprietary | Generally Colpitt oscillator-based | Typically multi-stage Gilbert cells |
| Gain | Low | High | High-very high on the order of 30-70 dB |

The LDA technology described herein concerns a regenerative logarithmic detector amplifier (LDA) with integrated FM demodulation (FM-LDA) that can receive wired or wireless FM, AM, or FM & AM signals with increased sensitivity, interference rejection, and bandwidth relative to circuits in current use. The LDA can also amplify signals while minimizing noise.

The FM-LDA achieves these goals with integral hardware that improves the signal-to-noise ratio SNR of an AM or FM input signal by restarting its cycle automatically, and without external means, whenever the input signal reaches a specific amplitude over time (threshold). The LDA circuit thereby converts amplitude or frequency modulated input to an output stream of low intermediate frequency ("IF") frequency pulses, in which the instantaneous frequency modulates with the input wave (i.e. AM/FM transposed to an IF band). This output stream is provided as a quasi-digital frequency-pulsed modulated signal. When AM modulated the conversion is made through an intrinsic logarithmic scale and then output.

The same frequency-pulsed modulated output can also be converted to baseband or demodulated (0 Hz to F_max) to a voltage varying with time via the adjunction of an analog frequency to amplitude converter, a peak detector or a digital counter, logic inverter, and digital rescaling circuit.

The innovative FM-LDA circuit can perform several functions, some simultaneously: Logarithmic amplification, signal regeneration, frequency conversion, noise filtering, interference rejection, and analog/digital amplitude/frequency demodulation. In AM mode, the output frequency is proportional to the logarithm of the input voltage.

- By amplifying the signal while reducing noise over n cycles, as part of the non-conventional process of frequency transformation, the LDA acts as a regenerative receiver and amplifier.
- An intrinsic log function converts linear input to logarithmic output, making the detection possible at very low input levels which allows for roughly 100 dB of usable dynamic range.
- The LDA can transcode an FM input to a different frequency.
- The LDA can use adjustable frequencies to handle various channels and circuit boards.
- The LDA receiver circuit provides very high sensitivity.
- The LDA is cost-effective, scalable, and capable of being integrated directly into IC chips.
- The LDA can accommodate analog, digital, AM, and FM demodulation. Other type of demodulation such PM are feasible with the adjunction of additional circuitry—making it useful in a wide range of practical applications.

Applications are numerous. LDA technology can be integrated into nearly every electronic system that would benefit from higher sensitivity, higher dynamic range, lower power consumption, better interference rejection, increased bandwidth, better signal-to-noise ratio (SNR), longer range, and/or cleaner amplification.

FIG. 1 depicts example input and output signals from an LDA. An LDA can give a low-level input signal 101 within its frequency capture bandwidth, masked by white Gaussian input noise 102. The LDA can regenerate an amplified input signal 103 over a number of periods, until reaching a threshold level. When the input threshold level is reached, the LDA can generate an output pulse, and restart its cycle.

Because Gaussian noise is random and uncorrelated with the input signal, and as the regenerated amplified input signal 103 increases, the noise can be averaged out and kept to the same value therefore not amplified over a number of periods, as shown by reduced noise 104.

Figure 2:
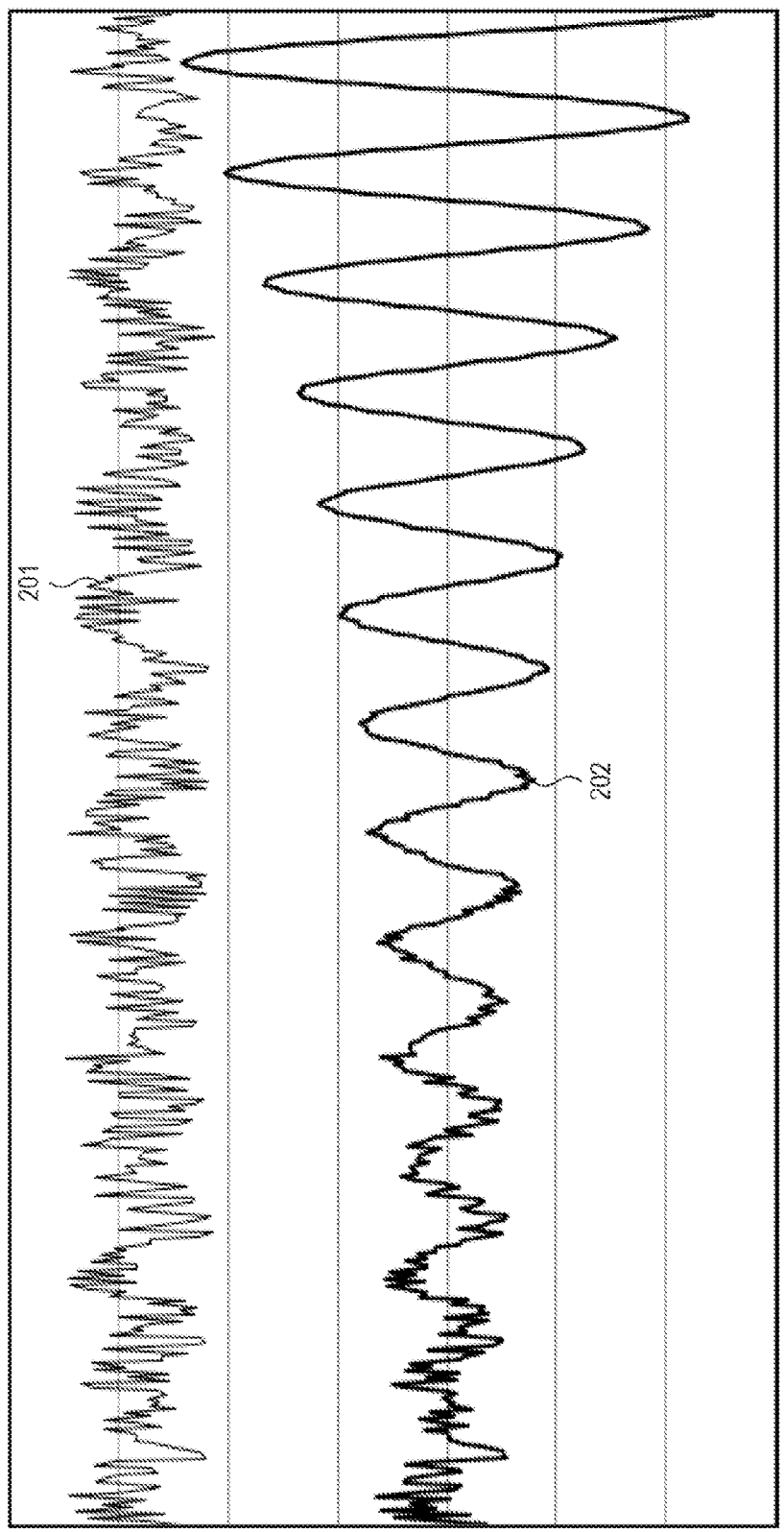
FIG. 2 depicts a combination of the input and output signals from FIG. 1.

FIG. 2 depicts a combination of the input and output signals from FIG. 1. When combining input signals 201 over a number of periods, the resulting curve 202 represents a regenerated and amplified signal with reduced jitter over time.

This effect is similar to a LASER in which photons are amplified in a cavity at a specific wavelength. At a resonance frequency, a standing wave builds up energy constructively over time. At the end of the buildup period, a discharge of higher energy is produced, and the process restarts.

The following example explains the regeneration process that takes place from the noise floor with a slow buildup of coherent energy (and reduction of amplitude jitter). There is a large noisy room with two similar mechanical forks of high quality factor and identical frequency resonance, each on a different sides of the room. The first fork (excitation source) is beating at a low and constant level. The second fork can barely "hear" the first one due to the high level of noise. After some time, the second fork will amplify and resonate at the tone frequency of the first fork with high amplitude level irrespective of the noise level in the room due to its high quality factor, due to the weak coupling between both forks and finally due to its slow synchronous buildup of mechanical energy. An important factor is the slow response in order to build up the signal but average out the random noise.

Figure 3:
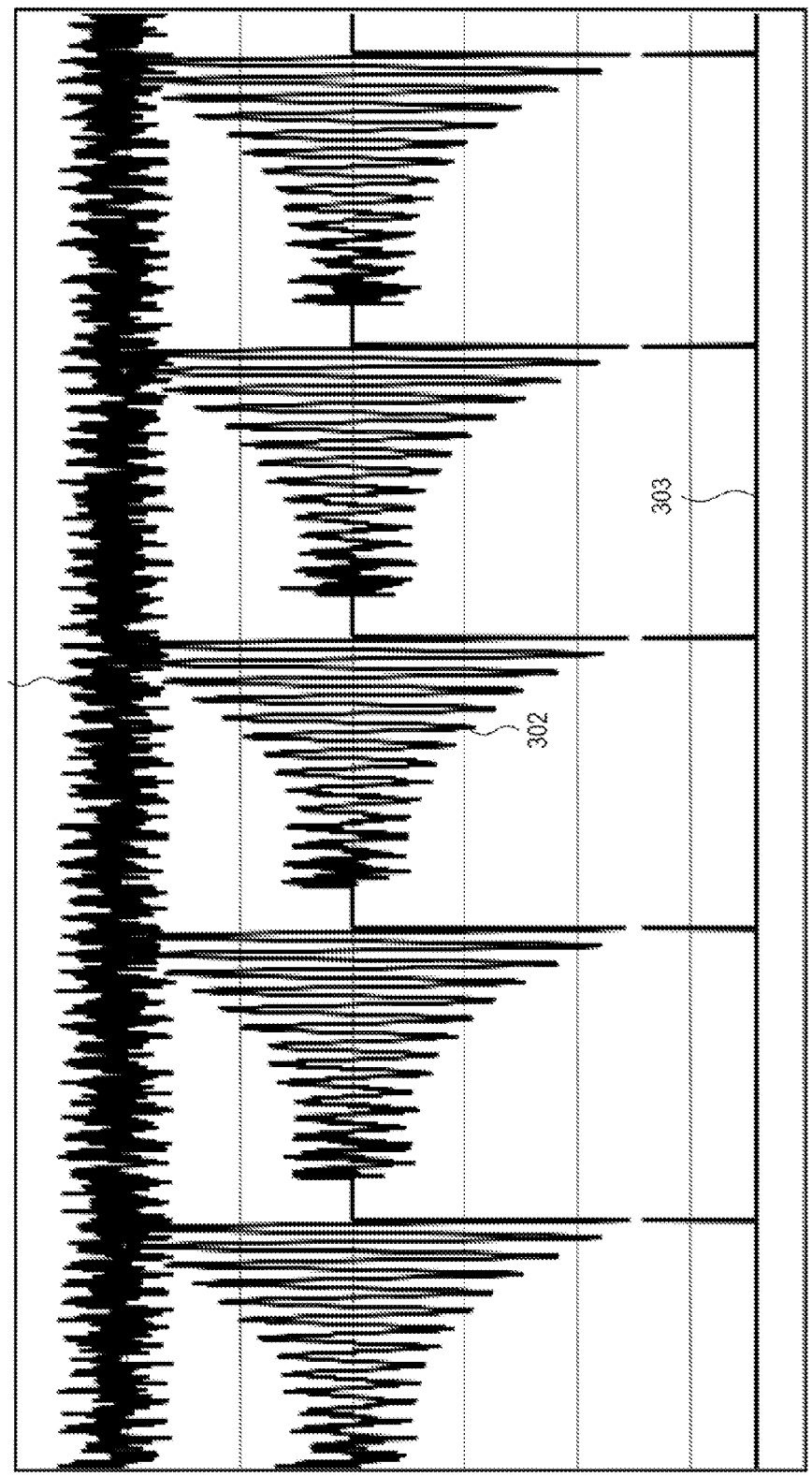
FIG. 3 depicts an input with signal and noise, a regenerated signal, and output frequency pulses at low level.

FIG. 3 depicts an input with signal and noise 301, a regenerated signal 302, and output frequency pulses 303 at low level.

Figure 4:
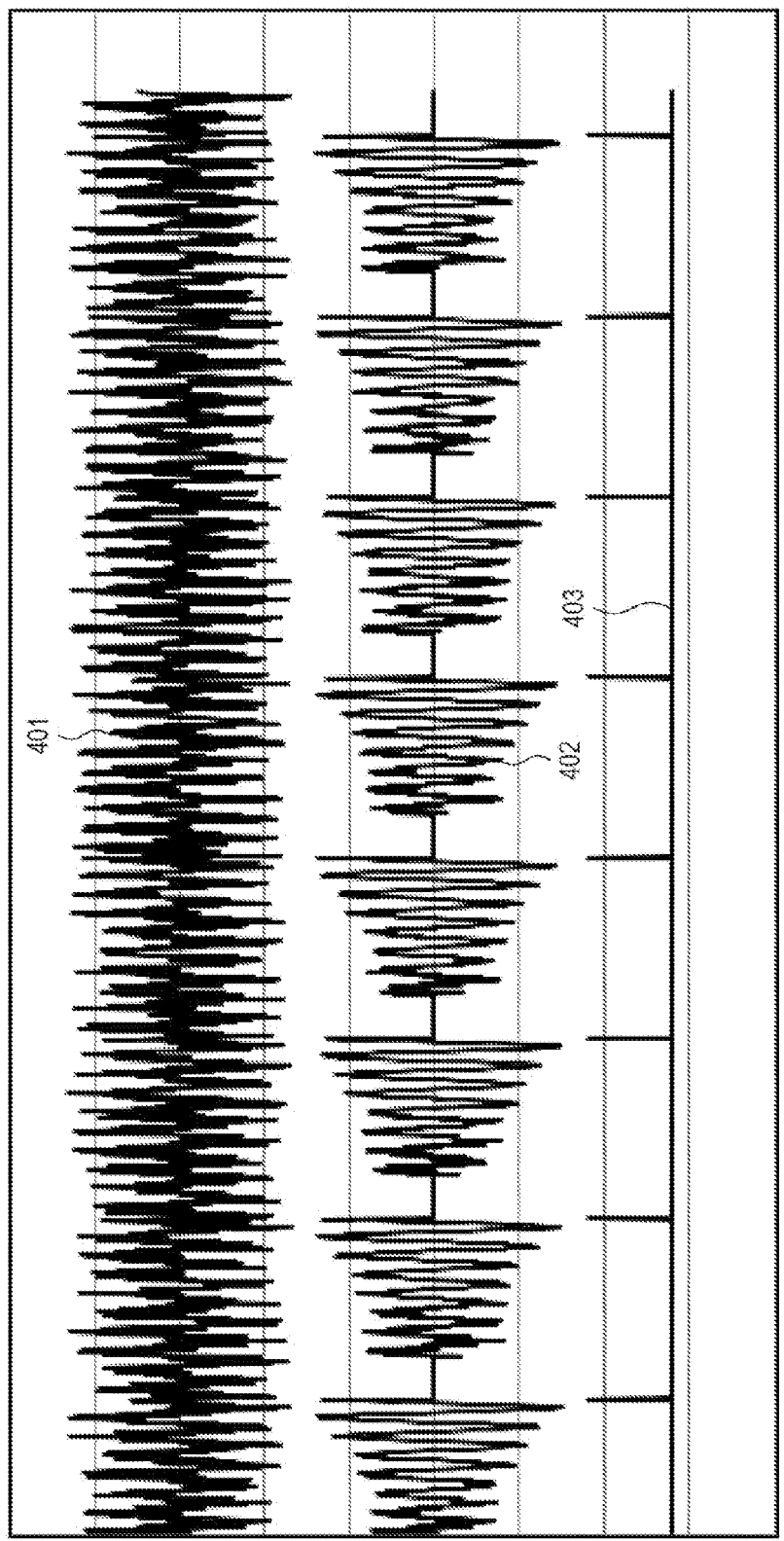
FIG. 4 depicts an input with signal and noise, regenerated signal, and output frequency pulses at higher input level.

FIG. 4 depicts an input with signal and noise 401, regenerated signal 402, and output frequency pulses 403 at higher input level. FIGS. 3 and 4 show a longer time scale of the input, and the effect on output frequency: the input signal (including noise) is shown in at the top, the regenerated signal is shown in the middle, and the output repetition rate is shown at the bottom. When the input signal is at a low level, as shown in FIG. 3, the LDA takes time to regenerate the signal and reach a constant threshold value. In the time window of FIG. 3, five regeneration cycles are created. FIG. 4 shows a higher input signal and a corresponding faster regeneration time to reach the threshold. As a result, the LDA produces more regeneration cycles in the same time window. In addition, the output pulses are almost constant in amplitude for any low-to-high input signals, which is remarkable given the large dynamic range involved.

As far as the AM mode, the output frequency of the LDA is proportional to the logarithm of the input voltage:

$$F_{OUT}=F_0+K\times\log(V_{IN_{RMS}}) \text{ in Hz, or}$$

$$F_{OUT}=F_0+K_2\times(L_{IN_{dB}}) \text{ in Hz}$$

where:
$F_0$ is a minimum fix frequency,
K and $K_2$ are constant values,
$V_{IN_{RMS}}(t)$ is the RMS value of the input signal $V_{IN}(t)$,
$L_{IN_{dB}}$ the input level $L_{IN}$ in dBm,
$F_{OUT}(t)$ is the output frequency.

The ability of LDA technology to enhance the transport of information, in both wired and wireless systems, is based on the generation of an output frequency that can be easily converted into a pulse stream of data with logic levels. The information is in the frequency, not the amplitude domain.

If desired, the output frequency can be converted into voltage modulation in analog or digital form. In this case, the output voltage after low pass filtering becomes:

$$V_{OUT\_RMS}=K_3\times\log(V_{IN_{RMS}}) \text{ in V, or}$$

$$V_{OUT\_RMS}=K_4\times(L_{IN_{dB}}) \text{ in V}$$

where:
$V_{OUT\_RMS}(t)$ is the output voltage, and
K3 and K4 constant values.

An LDA with FM demodulation circuit can possess many intrinsic properties of value to a wide range of commercial technologies. The following paragraphs include a non-exclusive list of the types of value that may be possible from an LDA with FM demodulation circuit.

The conversion of voltage modulated input signals to frequency modulation in the IF range, and the use of logarithmic decompression, are particularly effective at reducing noise and expanding the dynamic range of weak signals relative to noise. These attributes make the LDA ideally suited to many applications, such as:
  splatter-prone radar; micro-signal medical devices like ultrasound, MRIs, and CAT scans; fish finders and sonar in general; and collision avoidance;
  signal analyzers, power meters, and RF transmitter amplifiers;
  wireless networks such as Wi-Fi;
  simple, low power consumption frequency-to-digital converters based on LDAs, as a replacement for high resolution, fast, but expensive AD converters;
  pipeline metering and communication in the oil, water, and gas industries; and,
  replace expensive ADC converters with several possible configurations of LDAs and PLLs.

The ability of LDAs to filter random noise from weaker signals gives them the means to extract, for example, a few dBs of signal from the noise floor for smart phone devices or cellular base station receivers. To further reduce the output power of cell phones (improved RF budget link), and thereby extend their battery life and range, LDA technology can be integrated into mobile phones. Further, cellular base stations can use LDAs to recover weaker signals. LDAs can also reduce the power consumption of microprocessors, such as CMOS processors, by integrating the LDAs directly into processing chips.

Since the LDA regenerates the input signal and actively reduces noise, the LDA can significantly increase the SNR ratio even if placed after the first or second block in an amplification chain. For instance, a very good sensitivity for FM radio demodulation at 88-108 MHz has been measured when combining an LDA with a low-noise amplifier.

LDAs can demodulate directly analog/digital AM, FM and other modulations such as FH-SS, and n-ary analog and digital FM and AM modulations with the addition of more circuitry such as PLL(s), mixer(s), synthesizer(s), etc.

LDAs can regenerate many types of low level RF signals if tuned near or at the RF modulating frequency. Simplification of a wireless digital receiver can be obtained by using the LDA to replace several functions of a standard digital receiver (RF to low intermediate frequency or to baseband with direct digital conversion).

In baseband microvolt sensors (e.g. audio bandwidth 20 Hz-20 KHz), the LDA can be used as a very low noise and high discrimination conversion gain amplifier with digital output.

Figure 5:
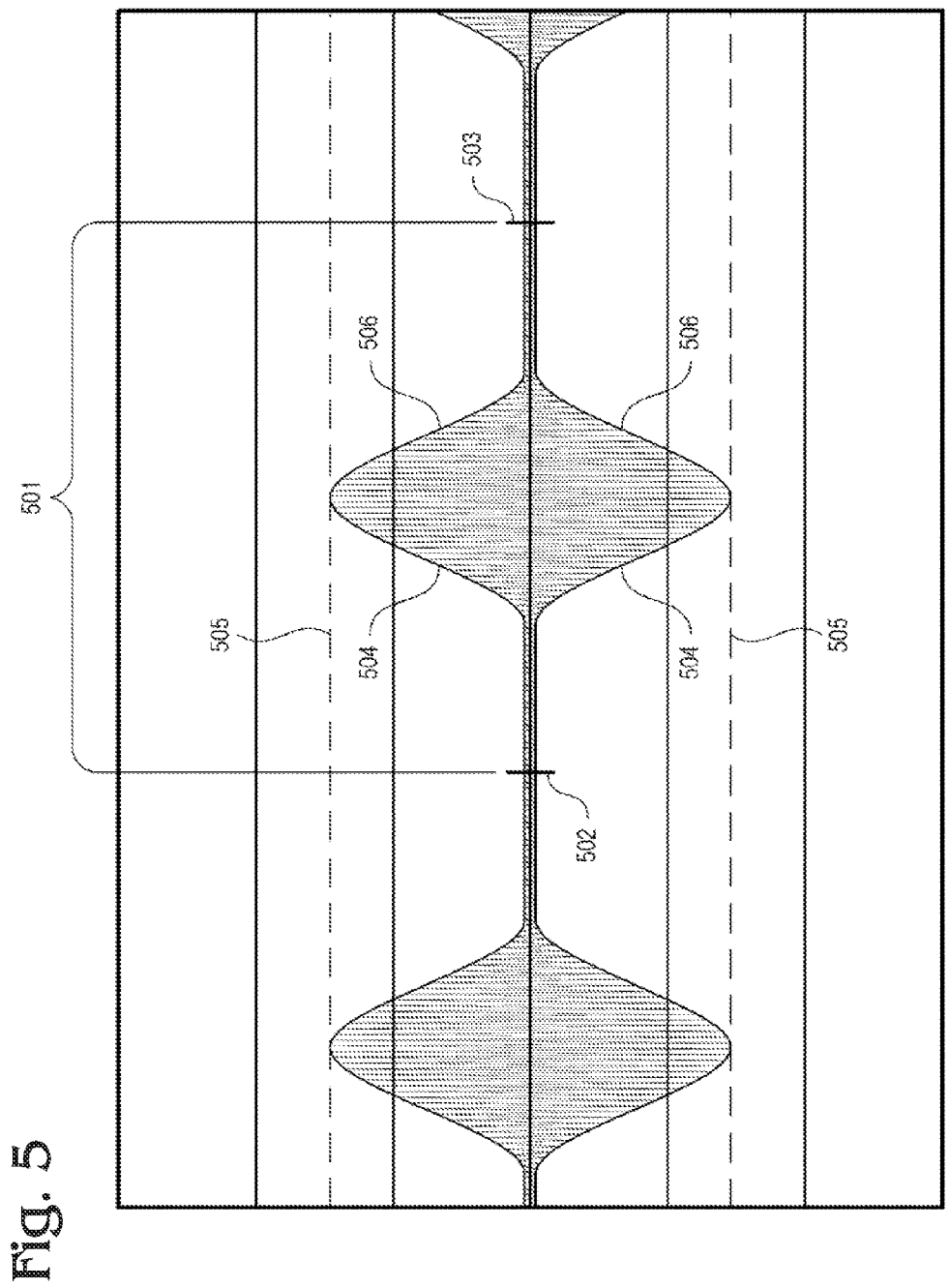
FIG. 5 depicts time variant oscillations and quenching cycle of an LDA with FM demodulation capability.

FIG. 5 depicts time variant oscillations and quenching cycle of an LDA with FM demodulation capability. In one embodiment, the LDA can be regarded as a LC circuit with a variable conductance, the latter varying cyclically from positive to negative. More specifically, FIG. 5 depicts a cycle 501 from the start of the cycle 502 to the end of the cycle 503. The oscillation builds up 504 until it reaches a threshold level 505 where the oscillation is shunt 506 progressively to zero.

Figure 6:
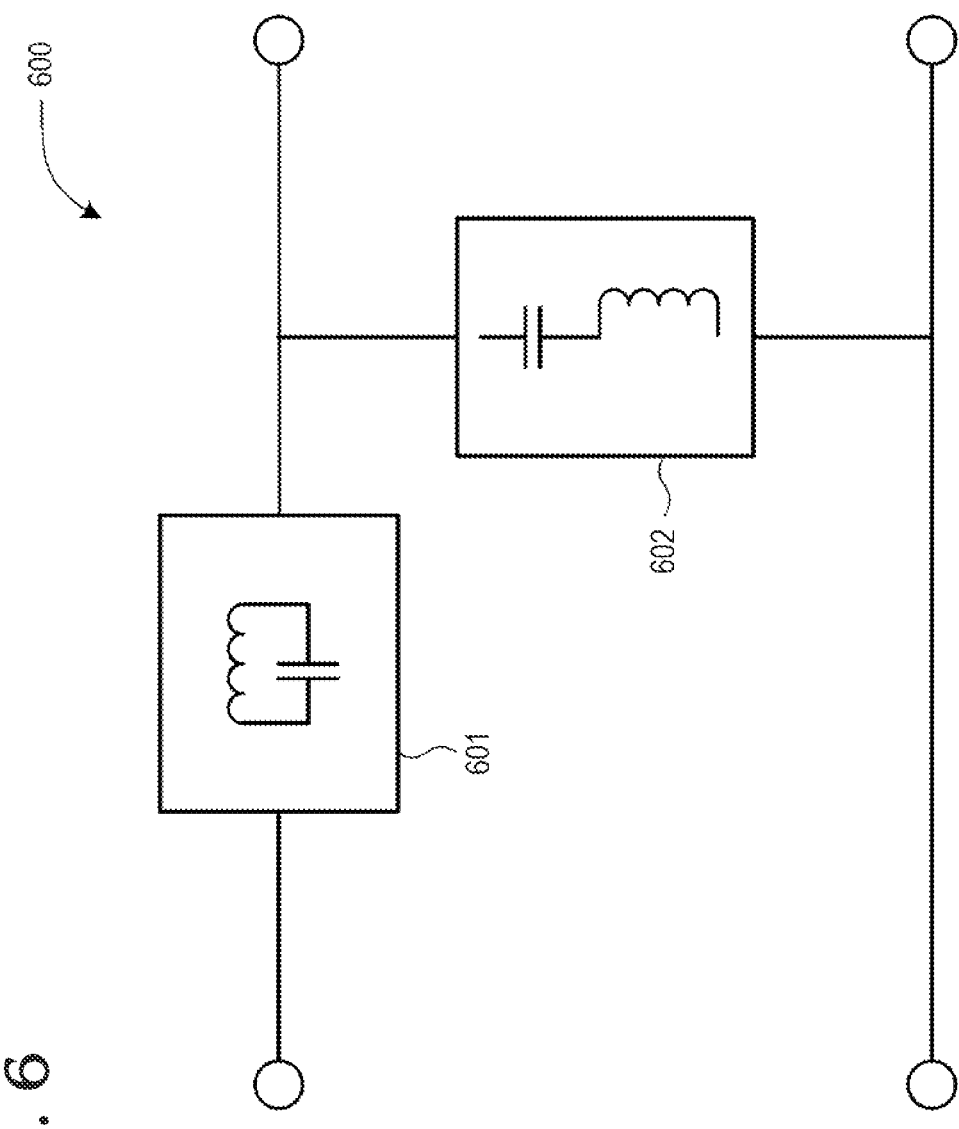
FIG. 6 depicts a quadripole with a parallel resonant circuit and a series resonant circuit.

FIG. 6 depicts a quadripole 600 with a parallel resonant circuit 601 and a series resonant circuit 602. The LDA with FM demodulation capability is based on the use of a quadripole made of a parallel and series resonator circuits 601 and 602 as shown in FIG. 6. It is designed to be a bandpass filter with a null phase in the passband. An example of parallel resonant circuit is an L an C connected in parallel, a line of transmission having open(s) or short(s) stub(s) adequately placed, a crystal resonator, a SAW circuit, a BAW, or a combination of these. An example of series resonant circuit is an L an C mounted in series, a line of transmission having open(s) or short(s) stub(s) adequately placed, a crystal resonator, a SAW circuit, BAW, or a combination of these.

Figure 7:
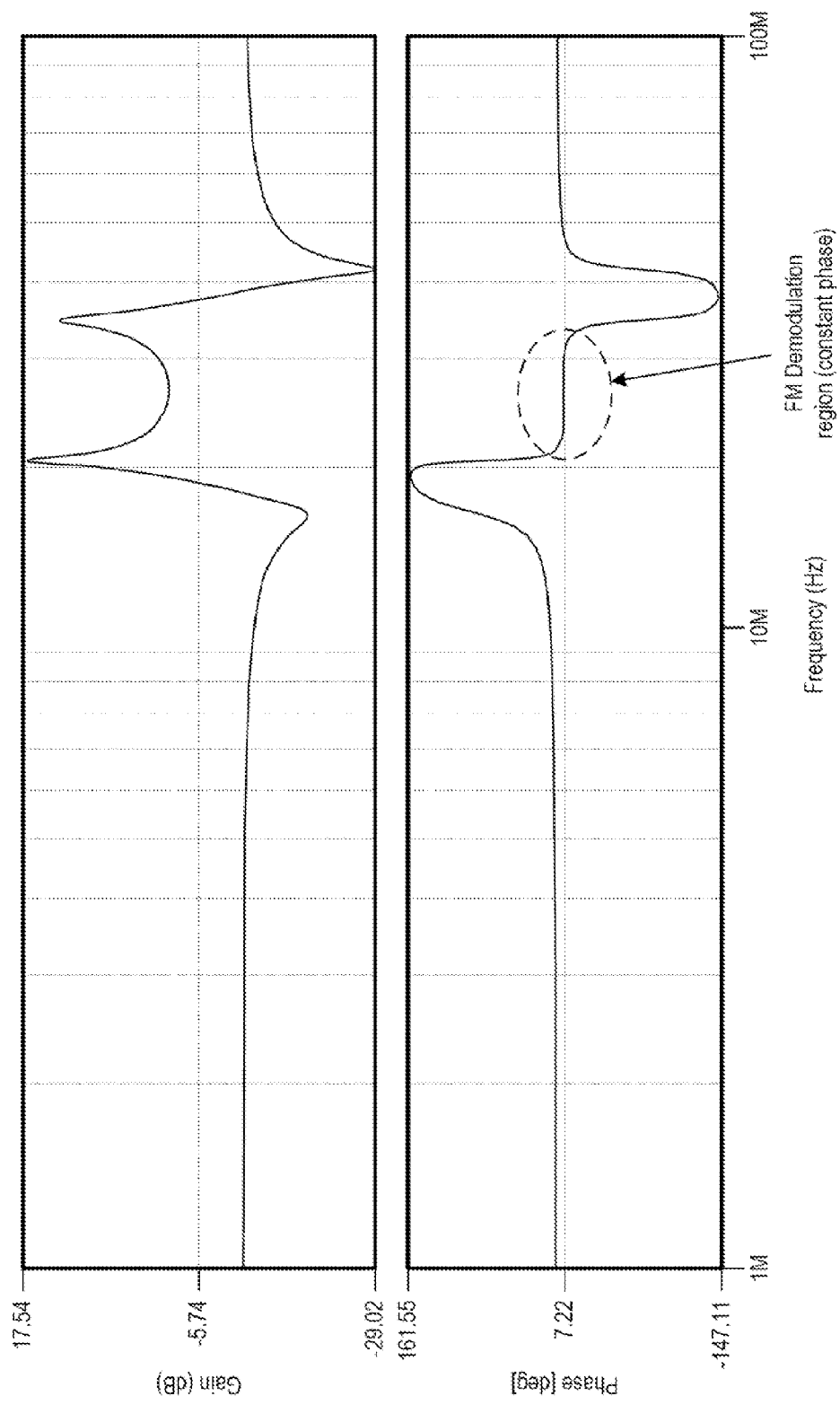
FIG. 7 depicts a Bode plot showing the approximate response of the quadripole.

The transfer function in amplitude and phase of the quadripole of FIG. 6 is shown in FIG. 7. Horizontal scale is frequency in Hz and vertical scales are respectively gain in dB and phase in degree.

FIG. 7 depicts a Bode plot showing the approximate response of the quadripole. The useful operating range for FM/AM demodulation in shown in the ellipse with dashed lines. The plots in FIG. 7 show the amplitude versus the frequency (top) and response phase vs. frequency (bottom). Depending on the design of the quadripole and interaction with the rest of the LDA, the gain can be designed to be flat or rounded versus pointy with the two spikes as shown in the diagram.

Figure 8:
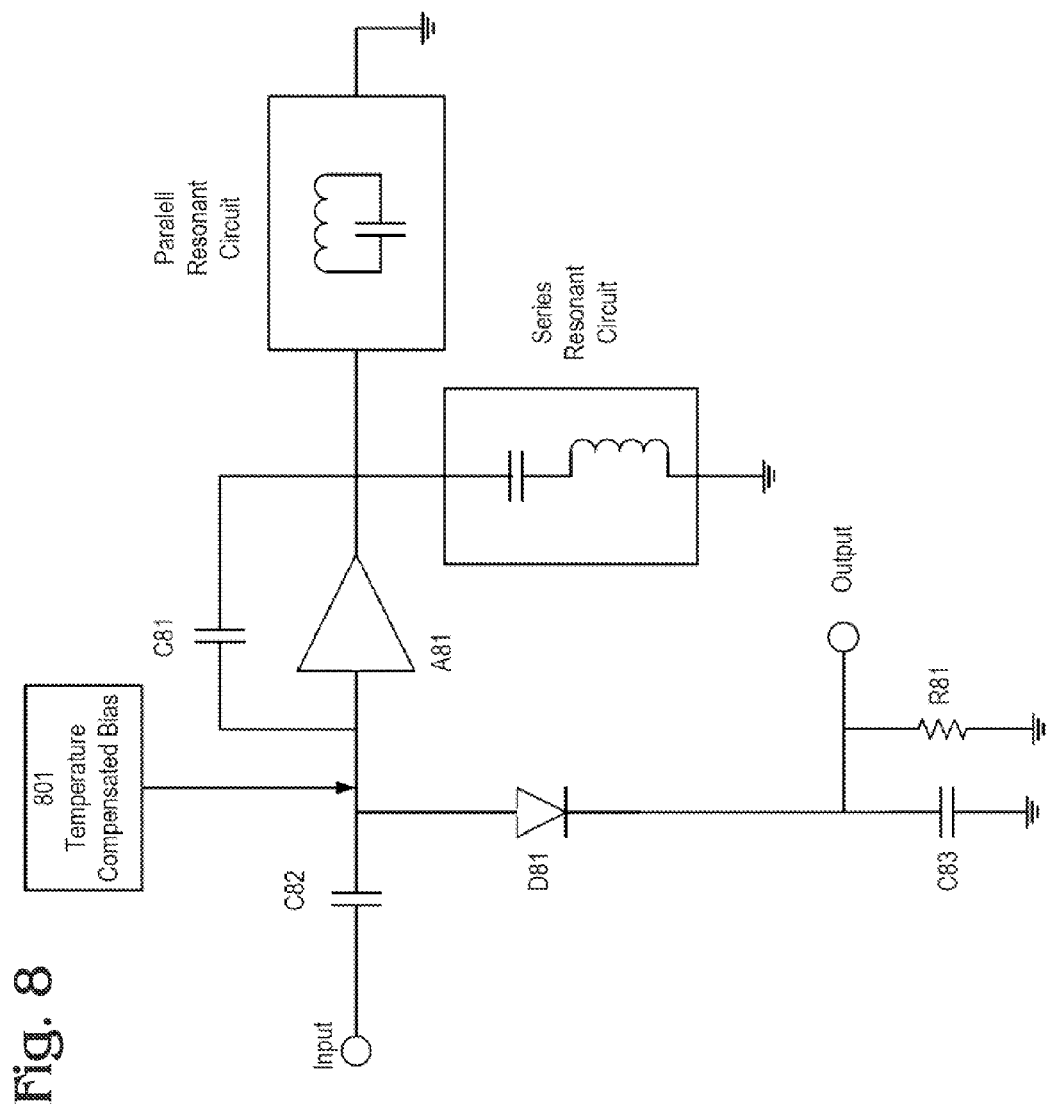
FIG. 8 depicts a block diagram of LDA with integral FM demodulation circuit.

FIG. 8 depicts a block diagram of LDA with integral FM demodulation circuit. The behavior principle is the following: An amplifier A81 is made to oscillate with the capacitor C81 in loopback. A typical amplifier may be a NPN, PNP transistor, a FET transistor, A MOS transistor, a dual gate FET transistor, etc. Also, the configuration of the active circuit can be Darlington, common-base, common collector, common emitter, cascode, differential pair, etc. Other types of amplifiers, such as single or multiple stages amplifiers, logic amplifier may be used. An amplifier can be made by any number of processes, such as Silicon, Bi-CMOS, GaAs, or any other process.

The simplest implementation is to have a 180-degree shift from the input 801 to the output of the amplifier A81 and the oscillation maintained with C81 as a weak or strong coupling. In other words, the value of C81 is selected to reduce the amplifier gain to a low value. The quadripole is added to the output of A81 and due to its high lower attenuation in the passband, making the amplifier resonate at or around the center frequency. The optimal FM demodulation mode occurs when the circuit is adjusted to operate at the center of the null phase range as shown in FIG. 7. Moreover the maximum frequency deviation that can be demodulated without distortion is equal or larger than the null phase bandwidth, so the bandpass filter quadripole can be designed to accommodate the target deviation, whether narrow or wide.

Another important piece of the LDA behavior is the RC circuit R81 and C83 acting as a sampling circuit. When connected to the amplifier, it charges cyclically and as its potential grows, the voltage across R81 grows that increase the output current of the amplifier. At the same time, the input bias current of the amplifier reduces and at a given threshold switches off the amplifier and therefore the oscillations. At this point, the charge accumulated into C83 discharges in R83 and as a consequence the voltage on R81 and C83 decreases to zero. The cycle restarts and since the potential on R81 and C83 is low the amplifier bias current tends to increase and after a little period of time the oscillation build up again.

After low pass filtering, the signal on R81 and C83 is the output repetition frequency and its shape may resemble the envelope of the cyclic oscillation frequency shown in FIG. 5.

The diode D81 couples the amplifier to the RC circuit R81 and C83 and acts as a low pass filter with good RF behavior. It has a low impedance when in conduction (positive half cycle of the input voltage) and high impedance when in non-conduction (negative half cycle of the input voltage), thus acting as a rectifier and low pass filter when loaded with a RC circuit.

The input is weakly coupled to the top of diode D1. The input matching is important and a good matching can improve the performance by a significant factor. An optional capacitor (not shown in FIG. 8) may be connected between the cathode of D81 and the bias of the amplifier to increase the coupling and facilitate the repetitive cycling.

In another implementation, the diode D81 can be replaced with an inductor of relatively high value, e.g. ten times the value of the inductance of the resonator, in the range of 100 nH to 1 mH. If the LDA oscillation operating frequency is too high, the parasitic may adversely impact the low pass effect and a more ideal component such as a diode may be used. In a further additional implementation, D81 can be replaced by an active component such as a transistor that is properly biased.

There are several types of FM discriminators or demodulators: Foster-Seeley, Travis, quadrature detector, PLL amongst other. The Foster-Seeley discriminator uses a special center-tapped transformer that is tuned for the frequency of use and two diodes in a full wave rectification. When there is no deviation, both halves of the transformer are equal. When a FM signal is applied, the balance is destroyed and a signal appears at the output that is proportional to the frequency deviation.

The Travis discriminator is similar to Forster-Seeley. The secondary of the transformer has a center tap and two opposite branches, each branch is connected to a tuning circuit and a slope detector. A first tuning circuit resonates slightly higher than the carrier, while the second one slightly lower. The output is the difference between the voltages of slope detector 1 and 2. When a FM modulation is applied and deviates toward a frequency higher than the carrier, the voltage of detector 1 goes positive while the one of detector 2 negative. The output voltage and difference between both is positive. When a FM modulation deviates toward lower than carrier frequency, the opposite happens and the output voltage becomes negative. The addition of the two resonance curves of opposite signs, gives a nice "S" curve characteristic output, for which the large middle section is linear.

In the quadrature detector, the input is split in two and one of the paths is delayed by 90 degrees and applied to a resonant LC circuit. The two signals finally feed a phase comparator and the result that is low pass filtered is the demodulated FM output.

The phase-locked loop (PLL) is one type of FM discriminator whose wide-spread adoption occurred with the easy access of integrated circuits. The phase of the incoming FM signal is compared to the phase of a voltage-controlled oscillator (VCO). The result is low pass filters and controls the VCO. As the frequency of the input changes, a correction voltage appears at the phase detector, which acts to compensate the phase difference by increasing or decreasing the phase and frequency of the VCO. If the loop bandwidth of the PLL is designed appropriately, the correction voltage to the VCO is also the demodulated output voltage.

In contrast, the LDA technologies disclosed herein bring some important novelties. An S-curve characteristic output is provided as with other discriminators, and the LDA simulates the performance of a Travis discriminator simply by having a low gain amplifier that only oscillates if the phase of input and output are 180 degree from each of other. However in the LDA technologies disclosed herein the S-curve exceeds the quadripole passband bandwidth. In consequence the FM-LDA does not need an automatic frequency control AFC as conventional FM discriminators and it does not need to sit exactly in the center of the S curve. With the LDA there is an auto-centering effect.

When the phase is distorted into the S-curve, the LDA oscillator tries to stay at the center of it. If the deviation goes high in frequency, the repetition rate decreases, if the deviation goes below or lower in frequency, the repetition goes faster. It is similar to having a power meter which can have three readings: close to center channel, center channel or above channel. If the S-curve is very wide, it can demodulate very wide FM. On the other hand, if the S-curve is narrow, it can demodulate narrow FM.

The output repetition frequency contains the phase and frequency information and is modulated at a low intermediate frequency by the FM input signal. Standard FM discriminators employ a constant amplitude. In the LDA technologies disclosed herein, this is provided intrinsically by the LDA that has a large amplitude input dynamic range and that provides an almost constant repetition rate amplitude regardless of the input amplitude large or very small. The baseband signal is recovered by an analog or digital frequency to voltage converter (FVC).

Since being regenerated by the FM-LDA, the advantages here include one or more of the following: very high sensitivity over a high dynamic range, constant repetition output amplitude, high skirt ratio (high selectivity), and FM or AM demodulation that add a few more dB of amplitude to the baseband demodulation amplitude.

Figure 9:
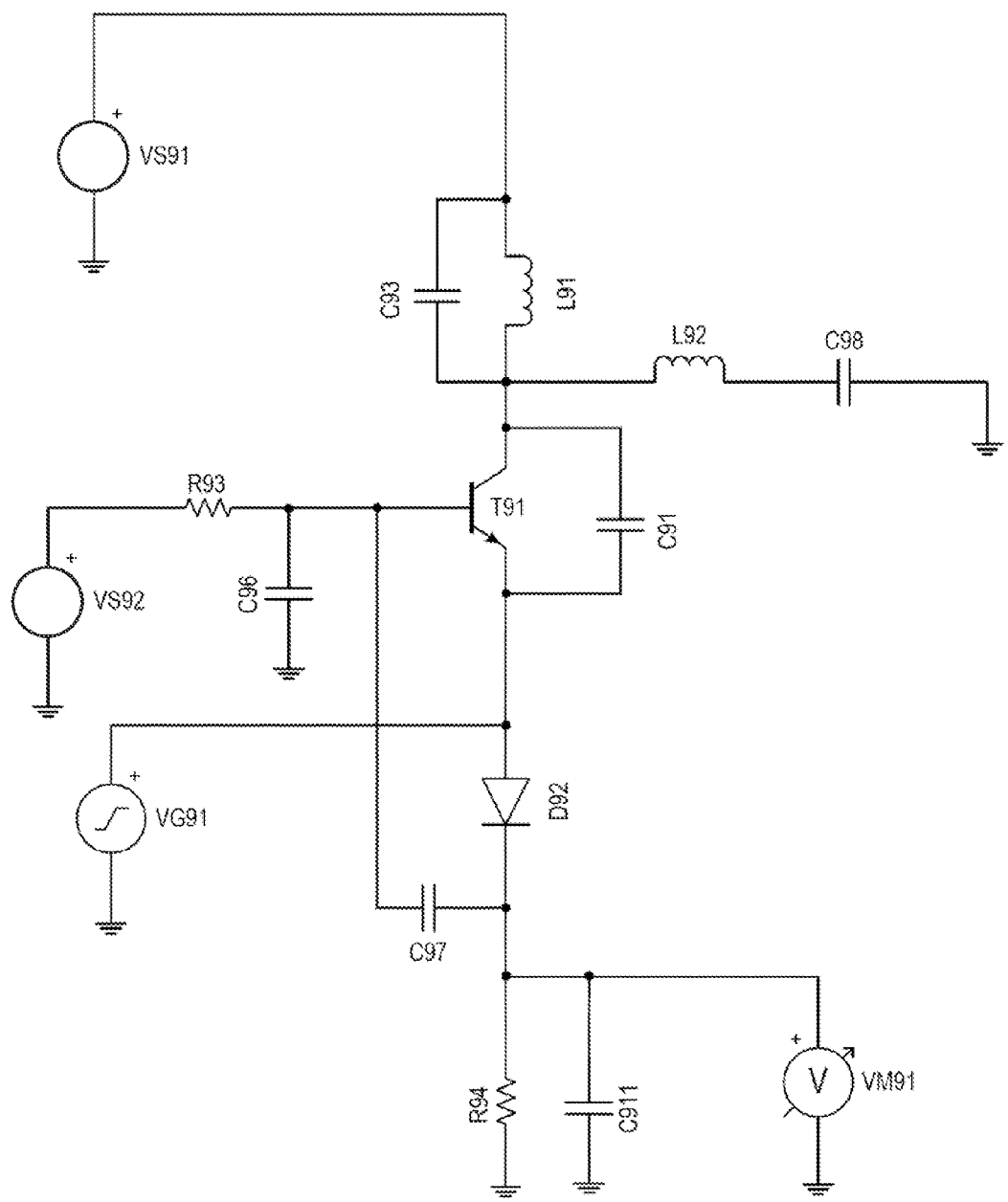
FIG. 9 depicts an embodiment of a schematic of an LDA with FM demodulation.

FIG. 9 depicts an embodiment of a schematic of an LDA with FM demodulation. FIG. 9 shows an implementation of an LDA with FM demodulation capability. The parallel resonator circuit L91/C93 and series resonators circuit L92/C98 are found on the collector of the amplifier. In one embodiment, the amplifier can be a NPN transistor. The transistor provides a 180 degree phase shift between collector and emitter, C91 the feedback oscillator capacitor, VG91 the input source signal coupled through a capacitor (not shown), the bias VS92, R93, and C96, D92 the diode coupling to the RC circuit R94, C911 and the output VM91. An optional C97 is shown for improving the quenching process.

Figure 10:
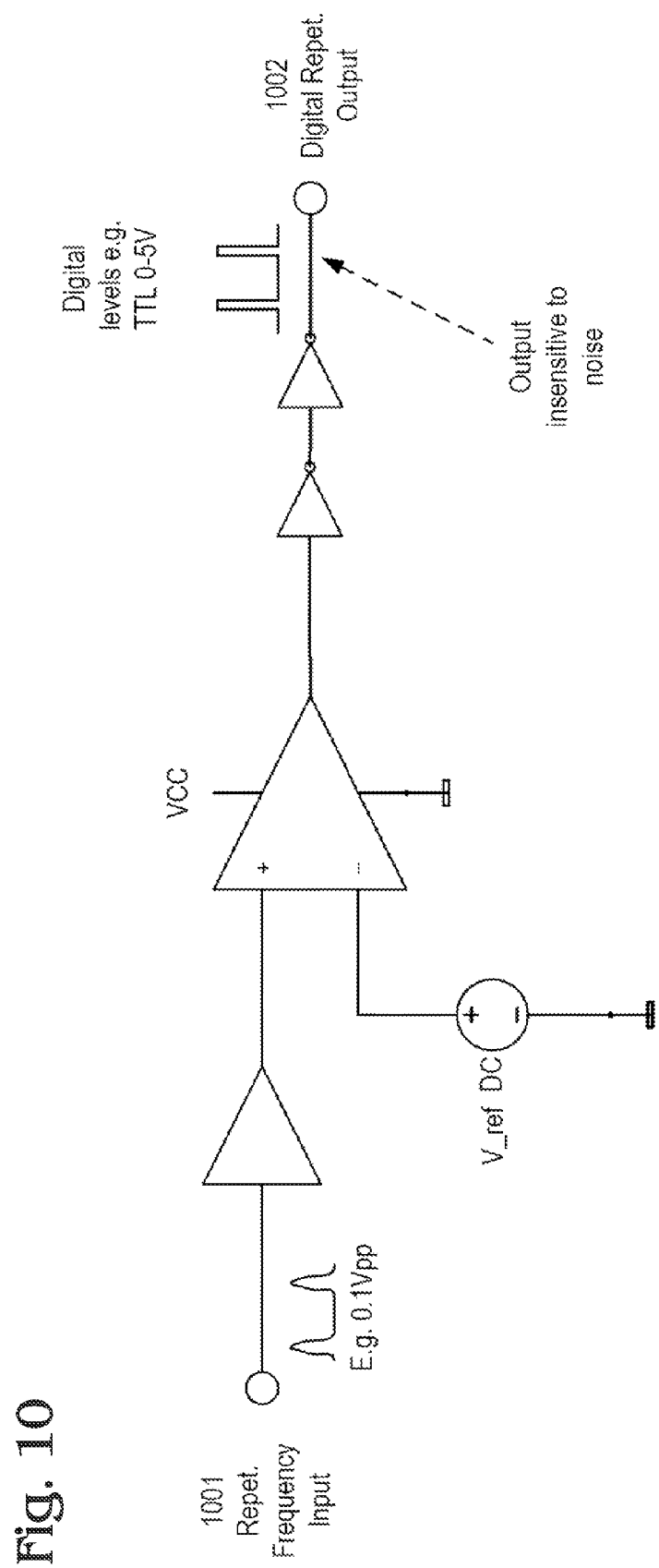
FIG. 10 depicts an example of a conversion of a pseudo-digital frequency input to a digital output pulse stream.

FIG. 10 depicts an example of a conversion of a pseudo-digital frequency input 1001 to a digital output pulse stream 1002. As discussed earlier, the repetition frequency rate is quasi-digital and needs little processing to be shaped in to a digital signal. First if the amplitude peak to peak is smaller than around 0.5 Vpp, it can be amplified. If as shown the amplitude is 0.1 Vpp, the gain is about 5 to 20. The amplification can be done in one or several steps. Thereafter the amplified signal is compared with a reference voltage V_ref and create a logic "1" when above V_ref and "0" otherwise. One or more logic gates can be added to provide sharp edges and TTL level to the now digital signal. The digital repetition frequency output signal 1002 can contain the information in phase and instantaneous frequency. As mentioned above, it can be carried over long distance or in a noisy environment and is noise insensitive since the information is not in amplitude.

Figure 11:
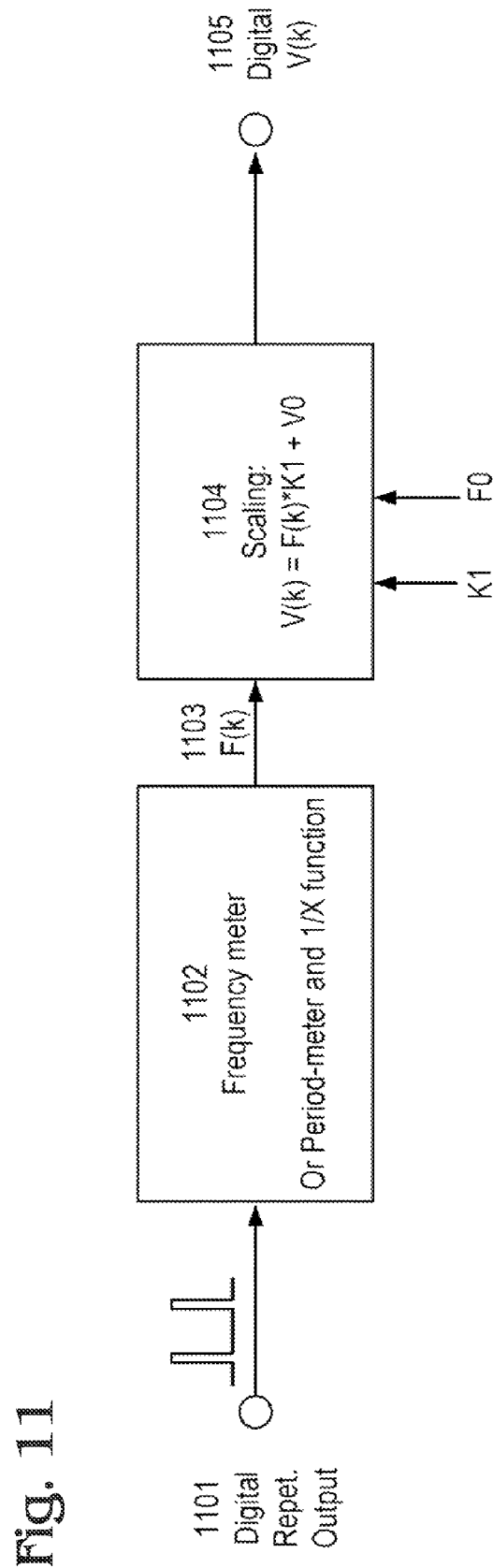
FIG. 11 depicts conversion of digital pulse stream to digital equivalent voltage sample.

FIG. 11 depicts conversion of digital pulse stream 1101 to digital equivalent voltage sample 1105. The digital repetition frequency signal 1101 can be converted into a digital voltage V(k) 1103 by going through an instantaneous frequency meter 1102. Alternatively, the digital repetition frequency signal 1101 can be passed through a period meter followed by a digital inverse function. The digital voltage V(k) 1105 is obtained after scaling 1104 as follow:

$$V(k)=F(k)*K_1+V_0$$

Where

F(k): kth sample of instantaneous frequency, $K_1$: a constant in V/Hz $V_0$: constant offset voltage that corresponds to the voltage (frequency) generated when the LDA input is terminated on 50 ohm. V(0)=F(k)*K1 at 50 Ohms.

Figure 12:
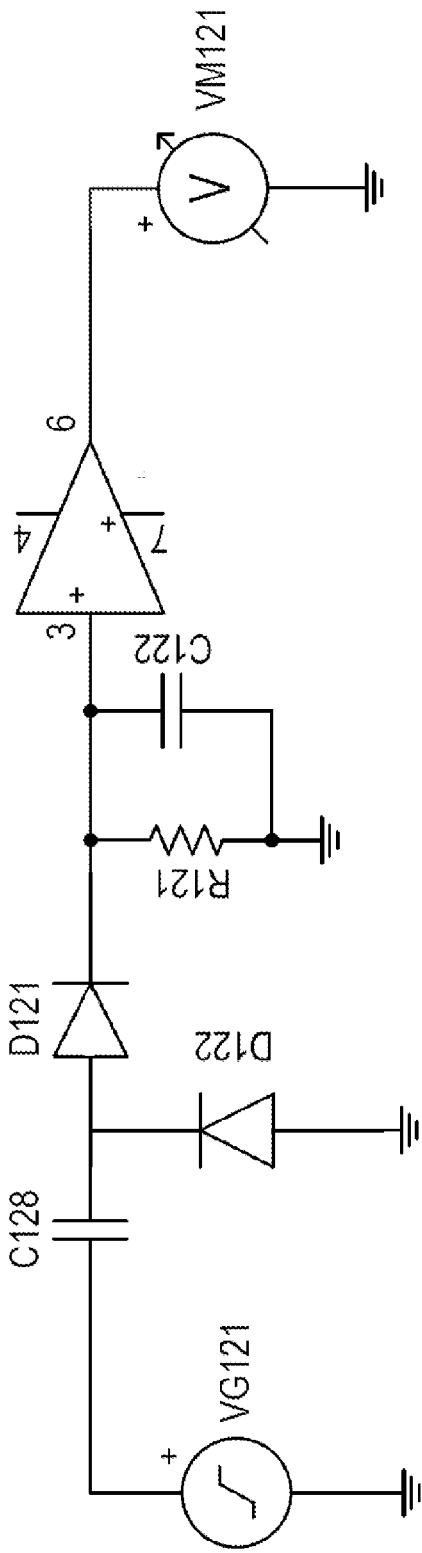
FIG. 12 depicts an example of an analog frequency to voltage converter.

FIG. 12 depicts an example of an analog frequency to voltage converter (FVC). The FVC can be used in conjunction with the FM-LDA. It connects to the repetition frequency output of the LDA. As its name indicates, it provides an output with mean value being the converted voltage. Further low pass filtering may be added. This is a simple FVC but it has some limitations: the slew rate is slower than the previous digital approach for instance and typically needs a few pulses to settle to an accurate mean voltage value.

Figure 13:
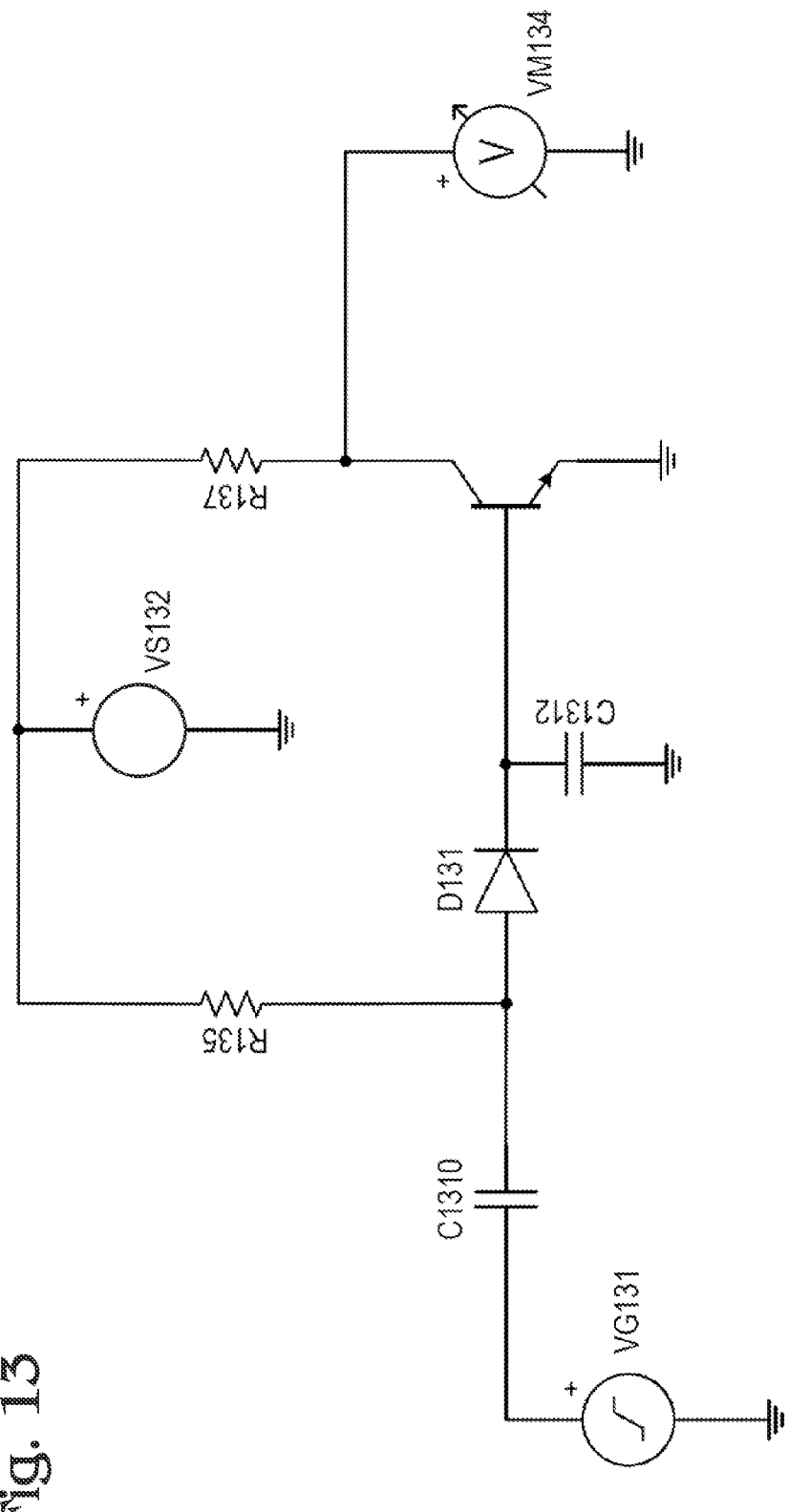
FIG. 13 depicts one embodiment of an analog detector.

FIG. 13 depicts one embodiment of an analog detector. Other embodiments are possible. The analog detector can be connected to the repetition frequency output (VM1), FIG. 9 or as well at the input of the amplifier, base of T91 of FIG. 4. Further low pass filtering and amplification may be added.

Figure 14:
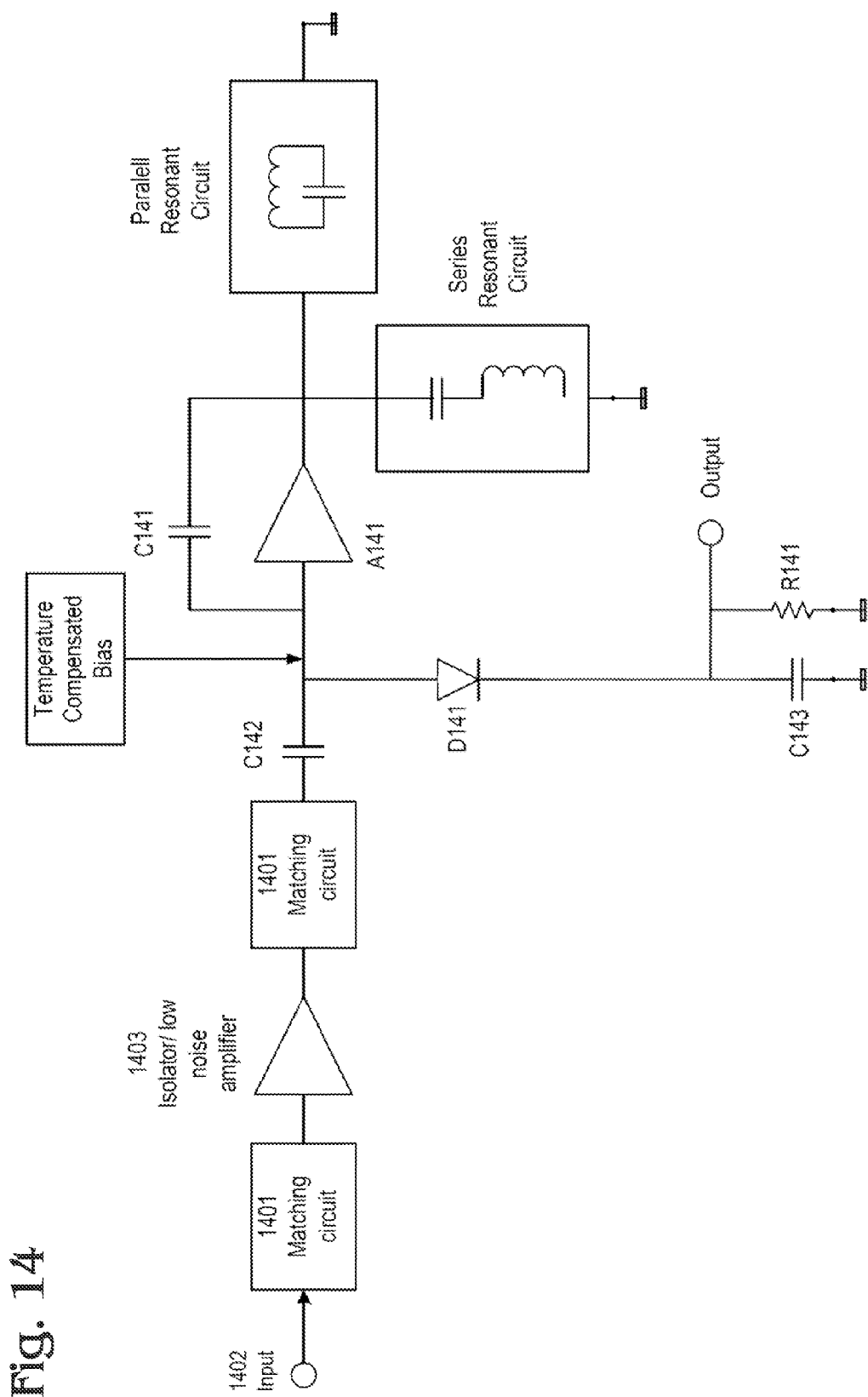
FIG. 14 depicts another implementation of an LDA.

FIG. 14 depicts another implementation of an LDA. In this embodiment of a FM LDA demodulator, the temperature compensated bias 1404 for the amplifier input A141 may be designed to temperature compensate the amplifier A141. For instance, if the amplifier is made of a bipolar transistor, its $V_{BE}$ will change with −2 mV/degree. If the DC bias voltage is made to decrease as well by −2 mV/degree, the DC voltage on the emitter will remain constant and therefore the DC current through the resistor R81 as well.

In another implementation of bias source, a temperature compensated current source may be used. When the amplifier is acting as a current amplifier with a constant low frequency gain, the output current will substantially be equal to the bias current multiplied by the gain. With a temperature compensated bias current the amplifier output current will also be temperature compensated, assuming that the low frequency gain remain constant with temperature. For instance, if the amplifier is made of a bipolar transistor, and if the DC base current is temperature compensated and constant, the DC collector current will be constant as well. The DC emitter current is the addition of both base and collector currents, that is also constant. A constant current across the resistor R81 creates a constant DC voltage irrelevant of the variation of the base-emitter voltage. The input bias current source being high impedance will automatically provide a voltage that will change with the base-emitter voltage $V_{BE}$ of −2 mV/degree and compensate it.

An LDA with FM demodulation may suffer from some weaknesses such as leak of RF energy from its oscillator throughout the input port. This is an aggravating factor for at least two reasons. First, when the LDA is used as the first stage in a RF receiver, the RF energy is fed backward to the antenna. This causes the antenna to radiate unwanted energy in possibly unintended frequency band(s) and cause EMI noise. Second, the leaking energy can be reflected back to the LDA input with a different phase versus the input signal-a fact that defeats the purpose of regeneration (regeneration is the slow buildup of a resonance phase coherent with the input signal). Therefore it reduces the RF sensitivity.

Also additional use of gain can be obtained when a low noise amplifier (LNA) precedes the log detector amplifier LDA. Indeed, being a regenerative device, the LDA may not conform to the noise law for linear circuits such as in a conventional receiver chain, where the first amplifier of the chain is the key element in determining the noise figure of the receiver, as defined by Friis' formula:

$$NF = 10*\log(F) \text{ in (dB)}$$

$$F = F_{A1} + \frac{F_{A2}-1}{G_{A1}} + \frac{F_{A3}-1}{G_{A1}G_{A2}} + \ldots \text{ in(.)}$$

where NF is the total noise figure, ratio in dB where F is the noise figure, ratio in linear;

$F_{Ai}$ is the linear noise figure of the $i^{th}$ amplifier of the amplifier chain; and, $G_{Ai}$ is the linear gain of the $i^{th}$ amplifier.

In the case of a regenerative log amp, the regenerative part can improve the SNR when placed in first place, or at any location in the receive chain. Therefore the regenerative LDA can make good use of a preceding low noise amplifier even in a noise limited amplifier receiver chain. Such an LDA may amplify further a signal buried in the noise because the dynamic range is extended on the low side (noise level) of the signal. In such a noise-limited receiver but without LDA, the hypothetic addition of a LNA would be of little use since the system would be noise limited.

For instance, adding a 20 dB gain LNA in front of a noise limited receiver without LDA would barely increase the sensitivity level by 0 to 2 dB. On the other hand, by using a log amp with regeneration factor of say 8 dB would improve the sensitivity by a factor of 6 to 8 dB.

Therefore, the addition of a matching circuit(s) 1401 at the LDA input may improve the coupling with the preceding circuit and reduce the input reflections. Furthermore the addition of an isolator 1403 at the input 1402 (e.g., an amplifier with high factor of isolation) may further improve regeneration and gain opportunity.

As stated before, the LDA can be regarded as a LC circuit with variable conductance, the later varying cyclically from positive to negative. Consequently the input impedance may vary with time and moves, for example, on an arc in the low right quadrant of the Smith chart in relation with the time variant LDA oscillation cycle. Several input matching scenarios are possible:

A fix matched conjugate at the mean value.

A fix matched conjugate at the impedance value corresponding to the most interesting behavior point that is the signal buildup from the noise.

A fix matched conjugate at the maximum oscillation amplitude level (point in time where the threshold is reached).

A dual impedance matching at a point where a fix matched conjugate is at the mean value or at a point where a fix matched conjugate is at the impedance value corresponding to the most interesting behavior point that is the signal buildup from the noise.

Variable impedance for instance in synchronicity with the LDA behavior cycle.

Figure 15:
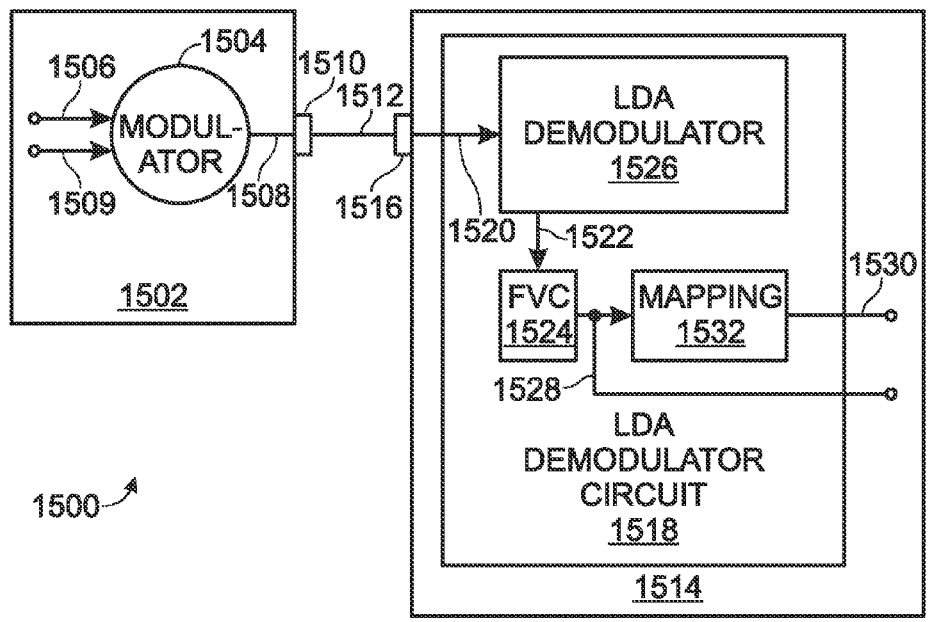
FIG. 15 is a schematic block diagram of a low-power, noise insensitive communication channel.

FIG. 15 is a schematic block diagram of a low-power, noise insensitive communication channel.

FIG. 16 depicts an exemplary communication scenario. The communication channel 1500, which may also be understood to be a physical layer (PHY) or Layer 1 in the Open System Interconnection-reference Model (OSI-RM), comprises a first device 1502 with a first modulator 1504. The first modulator 1504 has an input on line 1506 to accept a baseband signal with encoded information, and an output on line 1508 to supply a modulated signal having a first carrier frequency, including the encoded information. The modulated signal has a bandwidth sufficient to support the type of modulation used. The modulator 1504 can be implemented using a number of means that are well known in the art. To name just a few examples, modulation can be obtained by controlling the bias of a transistor or amplifier, or controlling the input to a voltage controlled oscillator (VCO) or mixer. In one aspect, the first modulator 1504 has a power control port on line 1509 to receive a variable power level control signal, which enables the first modulator to supply the modulated signal on line 1508 at a power level responsive to the power level control signal. The variable power level feature permits the modulated signal to be sent at minimally sufficient levels so as to minimize power consumption or reduce EMI. For example, the power level may be set as a result of a power setting protocol, where the power levels are adjusted, and the transmitter and receiver communicate to establish a minimally sufficient power level to enable the link. Similar protocols are used for example in wireless telephone systems.

Typically, the baseband signal might have a frequency of less than 20 kilohertz, and is an analog, an n-ary logic digital signal, or an audio (frequency) signal. Otherwise, the baseband signal may be a fast digital signal, as fast as 1000 MHz, such as might be used between a processor and a fast memory. As used herein, "n-ary logic" refers to the number of bits in an associated binary logic digital word, where $\log_2 (n)$ equals the number of bits. A binary logic digital word is a word composed only of "1"s and "0"s. Alternatively, "n-ary logic" refers to the number of possible conditions or states, where n equals the number of states. For example, a 2-ary or binary logic signal is associated with a one bit binary word or 2 possible states, and a 4-ary logical digital signal has 2 bits or 4 possible states. Typically, n is an even integer greater than 1. In one aspect not shown, the baseband signal may be a signal that has been converted from the digital domain to the analog domain using a digital-to-analog converter (DAC). When a VCO is used as the modulator, an analog signal at the input is converted to a modulated frequency at the output. A single (wire) input with an n-ary logic digital signal may be understood to be an analog signal with n possible input values. In another aspect, a digital-to-analog converter (DAC) accepts an n-ary logic digital single via multiples wires or a bus, and supplies an analog n-ary modulated signal. In the case of an n-ary signal carried on multiple input wires, a digital VCO can be used that accepts the n-ary logic digital signal, combines the digital signals, which are then supplied to the DAC via a multiple wires. Again, it is noted that the system described herein in not limited to any particular modulation technique or modulation device. Further, the system described herein is not limited to any particular frequency range or type of baseband signals.

The first device 1502 also has a first interface 1510 connected to a hardwire transmission medium 1512 to supply the modulated signal. Typically, modulated signal in a format such as frequency modulation (FM), phase modulation (PM), binary frequency shift keying FSK, n-ary frequency shift keying (n-FSK), Gaussian frequency-shift keying (GFSK), n-ary Gaussian frequency-shift keying (n-GFSK), minimum-shift keying (MSK), n-ary minimum-shift keying modulation (n-MSK), Gaussian minimum-shift keying (GMSK), n-ary Gaussian minimum-shift keying (n-GMSK), pulse width modulation (PWM), or amplitude modulation (AM). However, the communication channel is not limited to any particular type of modulation.

The hardwire transmission medium 1512 may be, but is not necessarily limited to, either a single-ended or differential signal medium, such as a printer circuit board (PCB) metal trace, conductive ink, conductive semiconductor trace, conductive polymer trace, bad conductor trace, meta-metal conductor, conductive trace, nanotube conductor, wire, wire twisted-pair, wire double twisted pair, wire quadruple twisted pair, DSL line, Ethernet line, connector, wire harness, microstrip, waveguide, fiber optic cable, power line, coaxial cable, or stripline.

A second device 1514 comprises a second interface 1516 connected to the hardline transmission medium 1512. A first logarithmic detector amplifier (LDA) demodulator circuit 1518 has an input on line 1520 connected to the second interface 1516, and an output to supply the baseband signal with the encoded information. The LDA demodulator circuit 1518 comprises a first frequency-to-voltage converter (FVC) 1524 to accept a series of second frequency pulses on line 1522 having a rate of change at least twice as great as the encoded information rate, in accordance with Nyquist.

These second frequency pulses are converted to a series of voltage levels at the encoded information rate on line 1528. The series of second frequency pulses may also be referred to herein as repetition frequency pulses, f_rep, or a quasi-digital frequency-pulsed modulated signal. If the encoded information is an audio signal, it may be supplied on line 1528. If the encoded information is an n-ary logic binary signal, then the first FVC 1524 initially converts the second frequency pulses on line 1522 into a series of voltage levels on line 1528. Depending upon the voltage levels obtained, the type of FVC circuit used, and the system requirements, the series of voltage levels at the encoded information rate on line 1528 may be used as an n-ary logic digital signal. Otherwise, the series of voltage levels are converted into one or more streams of digital logic levels on line 1530 using a mapping circuit 1532, as described in more detail below. In one aspect, as is the case of demodulating an audio baseband signal, the FVC circuit 1524 may simply be a low pass filter.

In one aspect the first modulator 1504 is a VCO accepting an n-ary logic digital signal on line 1506 and supplying an n-frequency-shift keying (n-FSK) modulated FM signal on line 1508. Then, the first FVC 124 supplies $\log_2(n)$ streams of baseband binary logic digital signals on line 1528, or the logs (n) streams of baseband binary logic digital signals are supplied on line 1530 in cooperation with the mapping circuit 1532. Alternatively, when n is greater than 1, a single stream of n different logic levels may be supplied by mapping circuit 1532.

Although the above-mentioned modulation formats are well known and widely used in the communication of information via wireless links, their use in a low-power hardwired transmission environment is novel. The goal of wireless communication links is primarily to extend the range at which distant devices can communicate in a very uncertain variable transmission medium (i.e. air). To that end, complex modulation formats have incrementally evolved, such as spread spectrum techniques. In contrast, one primary purpose behind modulating transmissions in the system described in FIG. 15 is to reduce the power levels needed to communicate between proximate devices connected by a known unvarying transmission medium, by making communications less susceptible to noise. Since the link between hardwired devices is constant and stable, relative simple modulation formats can be used. However, the advantages of modulating these transmissions would not be able to offset the added complexity and cost of using conventional receiver circuitry. Using the LDA demodulator circuit however, the power level needed to successfully communicate via even a simple modulation format (e.g. FM) over a hardwired link is much less the power needed to transmit equivalent baseband signals, and this advantage can be utilized with a minimum number of components. Typically, power consumption of a LDA with a modulated signal in excess of a 100 Mbps data rate with a carrier frequency of several GHz is a fraction of a milliamp at 2 V, which is about 1 mW in a discrete component implementation.

FIG. 16 depicts an exemplary baseband input signal such as might occur on line 1506 in FIG. 15. In this example, the baseband input signal is a binary logic digital signal. Also shown is the encoded information rate or data clock. The baseband signal is FM modulated, with the higher frequency modulation tone (fH) representing a logical "0" and the lower frequency tone (fL) representing a logical "1". In the lexicon developed above, the first carrier frequency may be considered to be the middle frequency between fH and fL. However, the first frequency is also intended to have a bandwidth sufficient to cover frequencies fH and fL. Subsequent to processing by the LDA demodulator, a series of second frequency pulses are supplied having a rate of change at least twice that of the encoded information rate, such as might be seen on line 1522 of FIG. 15. The period of the second frequency pulses associated with fL is $T_L$, and the period of the second frequency pulses associated with fH is $T_H$. The information is encoded as the instantaneous frequencies, or the period between pulses (TH or TL), as explained in the description of FIGS. 21-23 below. In order to distinguish between adjacent pulses, the bandwidth associated with the second frequency pulses may be higher or considerable higher than the encoded information rate.

Subsequent the FVC circuit, the series of second frequency pulses is converted to a series of voltage levels at the encoded information rate, such as would be seen on line 1528 of FIG. 15. Depending on voltage level and shape requirements, the series of voltage levels may be subsequently input to a signal conditioning or mapping circuit. Note: the amplitude levels of the signals in FIG. 16 are not drawn to scale.

Figure 17:
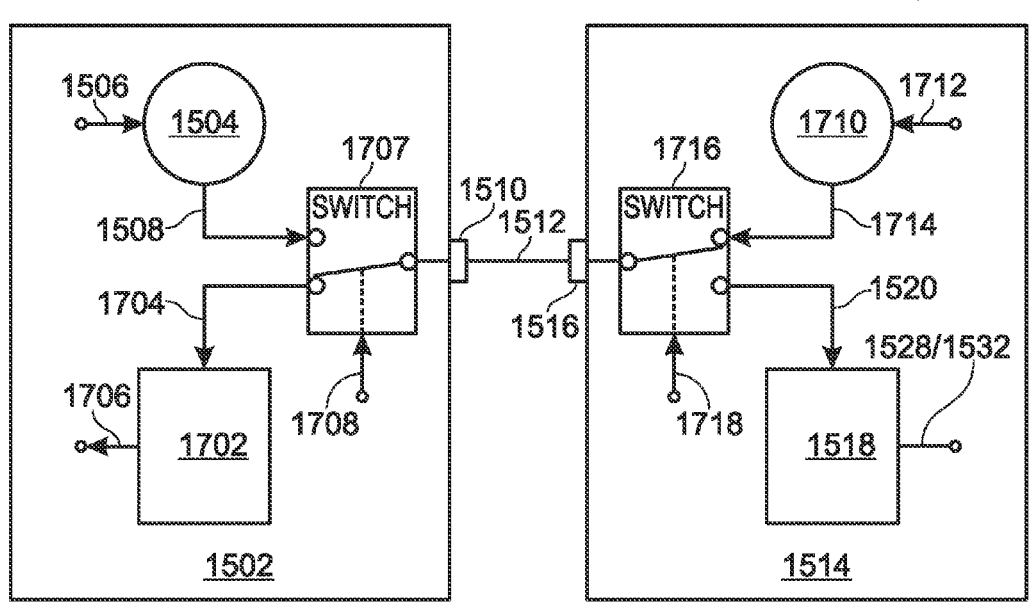
FIG. 17 is a schematic block diagram of a variation of the communication channel system depicted in FIG. 15.

FIG. 17 is a schematic block diagram of a variation of the communication channel system depicted in FIG. 15. In this aspect, the first device 1502 further comprises a second LDA demodulator circuit 1702 having an input on line 1704 and an output on line 1706. A first switch 1707 has an input connected to the first interface 1510, a first switch position connected to the input of the second LDA demodulator circuit on line 1704, a second switch position connected to the first modulator output on line 1508, and a control input on line 1708 to accept a first control signal selectively connecting the first switch input to one of the switch positions.

The second device 1514 further comprises a second modulator 1710 having an input on line 1712 and an output on line 1714. A second switch 1716 has an input connected to the second interface 1516, a first switch position connected to the input of the first LDA demodulator circuit 1518 on line 1520, a second switch position connected to the second modulator output on line 1714, and a control input on line 1718 to accept a second control signal selectively connecting the second switch input to one of the switch positions.

Figure 18:
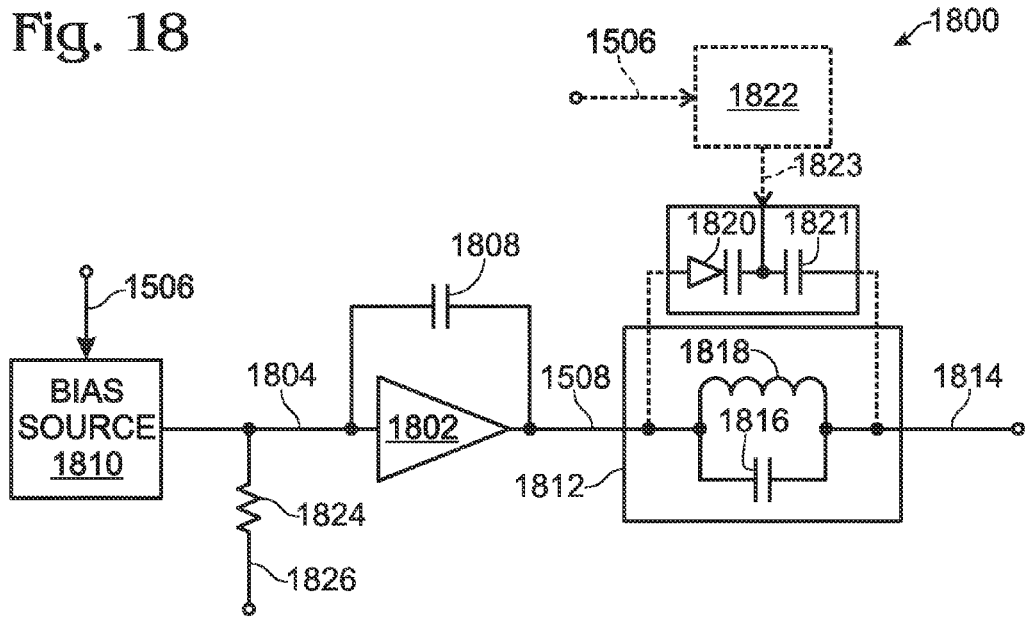
FIG. 18 is a schematic diagram of the first modulator of either FIG. 15 or FIG. 17, enabled as an LDA-VCO.

FIG. 18 is a schematic diagram of the first modulator of either FIG. 15 or FIG. 17, enabled as an LDA-VCO. The LDA-VCO 1800 comprises an amplifier 1802 having an input on line 1804 and an output on line 1508. A capacitor 1808 is connected between the amplifier input on line 1804 and output on line 1508 to control the amplifier gain. A variable direct current (DC) bias source 1810 is connected to the amplifier input on line 1804, responsive to the baseband signal on line 1506. A first parallel resonant circuit 1812 is connected between the amplifier output on line 1508 and a reference voltage on line 1814 (e.g., Vcc). The first parallel resonate circuit 1812 has a resonance at the first frequency. The amplifier output on line 1508 supplies a signal centered at the first frequency and modulated in response to the variable bias source. Resistor 1824 connects to amplifier input on line 1804 to a reference voltage on line 1826 (e.g., ground).

Here, the first parallel resonant circuit 1812 is shown enabled as lumped circuit components using a capacitor 1816 in parallel with an inductor 1818. However, as would be understood by one with ordinary skill in the art, such a circuit may be enabled using microstrip and stripline techniques. Alternatively, as shown in phantom, instead of modulating as a result of varying the bias current, a constant bias current is used with a varicap or varactor diode 1820 and capacitor 1821 connected in parallel with the first parallel resonant circuit 1812. The varicap 1820 accepts a variable tuning voltage on line 1823 from conversion circuit 1822, which is in turn responsive to the baseband signal on line 1506. The use of a varicap as a circuit tuning element is well known in the art. Alternatively, but not shown, the modulated signal on line 1508 may be taken from amplifier input on line 1804, or from the capacitor 1816, by splitting the capacitor into two series capacitors and sampling the intersection node. In one aspect not shown, the output of the VCO is feed to a phase-locked loop, which in turn modifies either the bias current or varicap tuning voltage so as to stabilize the VCO operating frequency.

Figure 19:
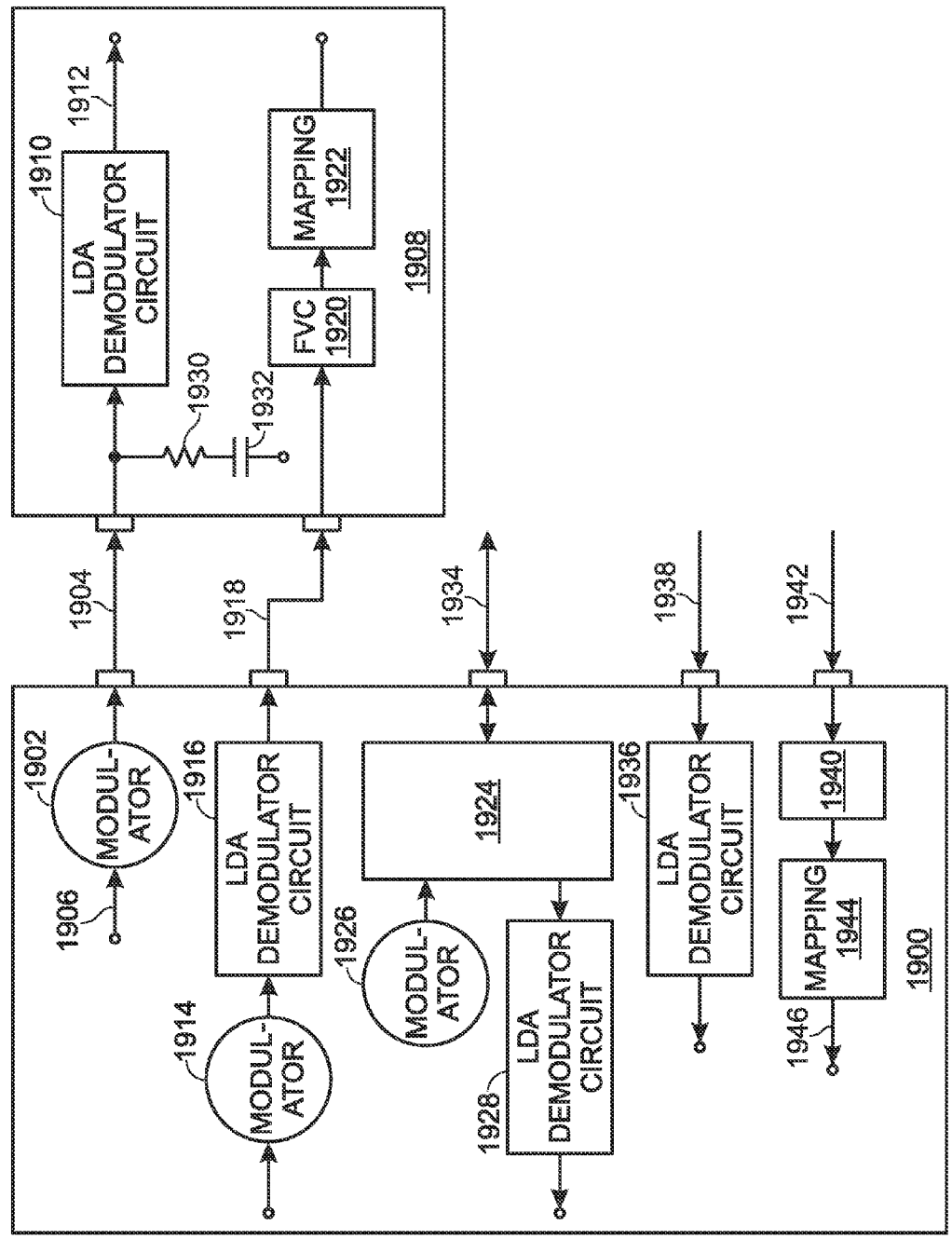
FIG. 19 is a schematic block diagram depicting a variety of LDA demodulator-enabled communication channels.

FIG. 19 is a schematic block diagram depicting a variety of LDA demodulator-enabled communication channels. Properties of the LDA permit the reduction of EMI and power consumption. To take one example, an LDA is able to demodulate FM at very low power level. FM is insensitive to noise and can be used as an information channel, as carried on PCB traces between integrated circuits (ICs). Continuous FM modulation has smooth transitions and thus, a low level of EMI. The LDA and its counterpart the harmonic VCO of FIG. 18 have a simple topology and typically don't use more than a few transistors. Low level FM (e.g., −40 dBm) can be generated by a simple low power VCO. Based on these properties, a physical communication can be established for logic circuits where the physical layer is FM modulated.

In a particular implementation, and due to the high noise immunity of FM, an n-ary symbol rate can be used (e.g. 4-FSK), such that the symbol rate is ½ the bit rate. However, in the interest of simplicity, 1 symbol=1 bit is used for illustration. Using the above-described communication channels, low-power/low EMI logic chips can be used that have a low internal voltage (e.g., 1V) to communicate with low FM modulated signals. The standard "0" and "1" Boolean signals are used only internal to the ICs. A VCO 1902 in IC 1900 has an output connected to hardwire transmission medium 1904. VCO 1902 is controlled by the logic internal signal on line 1906. For instance, F_max may be a logical "0" and F_min a logic "1". In this example, 100 MHz is generated in response to 0 V, and 150 MHz for 1 V. The VCO output level may be −40 dBm, or 6.3 millivolts peak-to-peak (mVpp) on a 50 ohm transmission line. The VCO's power consumption with a 1V Vcc and −40 dBm output is in the range of tens of micro watts (uW). A harmonic VCO 402, such as described in FIG. 18, requires just a single transistor and an LC circuit. Other VCOs that do not require an inductor may be even easier to integrate.

On the other end of hardwire transmission medium 1904 is IC 1908. An LDA demodulator circuit 1910, such as described in FIG. 15, has an output on an internal line 1912 to supply the baseband signal that matches the one used to modulate VCO 1902. Since the incoming FM modulated signal amplitude from the VCO 1902 is very small, the power consumption, even if terminated, is in the uW range. If hardwire transmission medium 1904 is terminated with a 90 ohm resistor, which corresponds to a typical narrow trace on a 4-layer PCB, the suppression and LDA matching are improved. Alternatively, a transmission line (e.g. microstrip) with a controlled impedance of about 90 ohms may be used. As another alternative, as shown, the hardwire transmission medium 1904 can be terminated with a resistor 1930 and a capacitor 1932 to a reference voltage such as ground or Vcc. Resistor 1930 may typically be 90 ohms and the capacitance of capacitor 1932 depends on the signal modulation or pulse frequency. The goal is to minimize the DC current flowing to ground and effects that unbalance the VCO 1902 or LDA demodulator circuit 1910, and to pass the modulated signal or pulsed signal on hardwire transmission medium 1918 with minimum attenuation.

Typically, the LDA has a sensitivity down to around −100 dBm with a bandwidth of a dozen MHz, so that at −40 dBm+/−20 dB, the LDA is well above its noise floor. The LDA's power consumption is minimal at 1V Vcc and −40 dBm output. Internal to the LDA demodulator circuit 410, the baseband logic signal may only have a small amplitude on the order of 100 mV. This small signal may be amplified with a simple amplifier to 1 Vpp and optionally regenerated with 1-2 gates.

As another option, VCO 1914 may send a modulated signal to LDA demodulator 1916 at a first carrier frequency. Hardwire transmission line 1918 carries a train of second frequency pulses at a relatively low peak-to-peak voltage (e.g., 50 mVpp). FVC 1920 accepts the series of second frequency pulses, converts them to a series of voltage levels at the encoded information rate, and the mapping circuit 1922 supplies a baseband signal matching the signal modulated by VCO 1914.

In another variation, a single-pole double-throw (SP2T) switch with an input on hardwire transmission medium 1934 switches either to the output internal port of VCO 1926 or the input internal port of LDA demodulator circuit to permit a half-duplex wired communication such as is common with logic processor pins that can be configured dynamically as an input, an output, or an open circuit. In the case of an open circuit, a SP3T switch might be used with one switch position left open or connected to a high impedance. In a similar manner, IC 1900 may include a LDA demodulator circuit 1936 to receive a modulated signal from a source (not shown) on hardwire transmission medium 1938. Finally, IC 1900 may include a FVC circuit 1940 to receive a series of second frequency pulses from a LDA demodulator circuit (not shown) via hardwire transmission line 1942. The voltage output of the FVC circuit 1940 is supplied to mapping circuit 1944, which in turn supplies a baseband signal on line 1946. The added complexity of any microprocessors, field programmable gate arrays (FPGAs), application specific ICs (ASICs), and logic circuit is very limited, and offset by a reduction in components that become unnecessary with the use of LDAs. Switches with additional throw positions may be used to create further options.

Although an example of FM modulation has been used to illustrate the example above, a similar implementation is possible using PM modulation. Likewise, a similar implementation is possible using AM modulation, However, the use of AM may impact the noise performance, especially if amplitude-shift keying (ASK) or on-off keying (OOK) is used, as they may generates EMI due to sharp amplitude transitions and may likewise be sensitive to EMI voltage noise.

Figure 20:
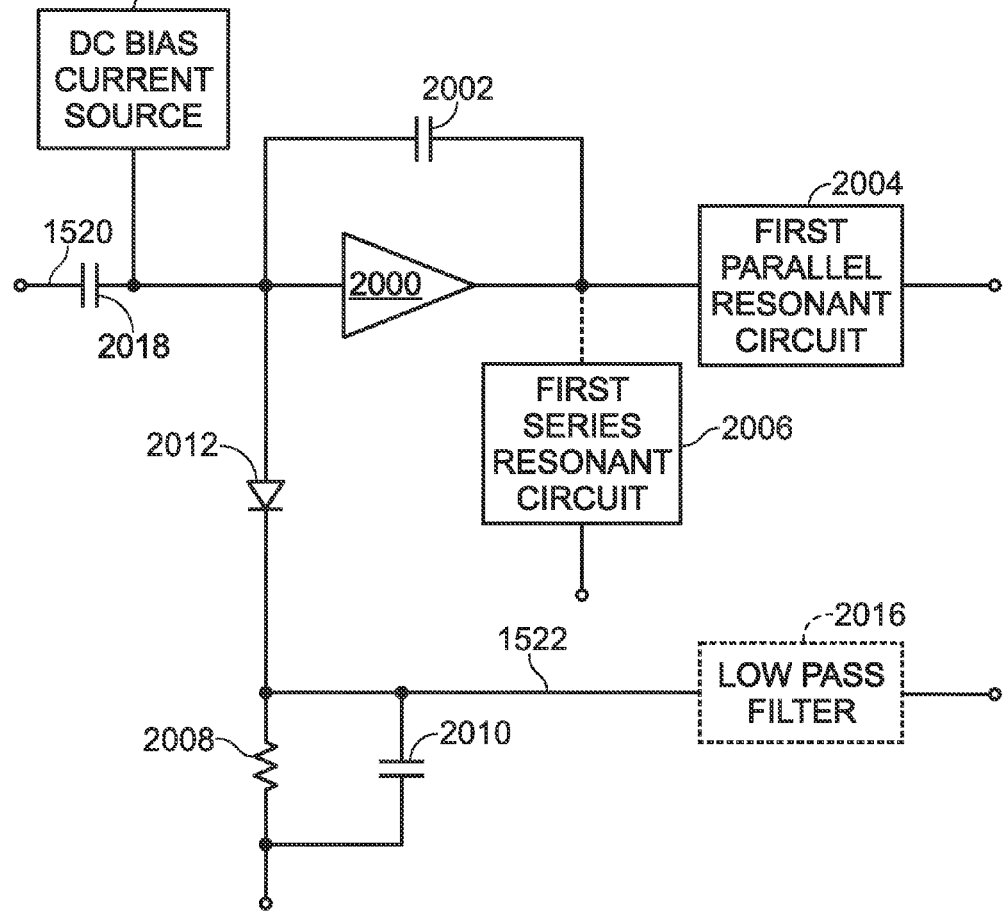
FIG. 20 is schematic diagram depicting an exemplary version of the LDA demodulator of FIG. 15.

FIG. 20 is schematic diagram depicting an exemplary version of the LDA demodulator of FIG. 15. The behavior principle is as follows. An amplifier 2000 is made to oscillate with the capacitor 2002 in loopback. A typical amplifier may be an NPN or PNP transistor, FET transistor, MOS transistor, or a dual gate FET transistor. Also, the configuration of the active circuit can be Darlington, common-base, common collector, common emitter, cascode, or differential pair, etc. Other types of amplifiers, such as single or multiple stage amplifiers, or a logic amplifier may be used. The amplifier fabrication process can be silicon, Bi-CMOS, gallium arsenide (GaAs), or any other semiconductor process. The simplest implementation is to have a 180-degree shift from the input to the output of the amplifier 2000, and the oscillation is maintained with capacitor 2002 as a coupling element to control the amplifier gain. In one aspect, just a parallel resonant circuit 2004 is connected between the amplifier output and a reference voltage (e.g. Vcc). In another aspect, a series resonant circuit 2006 is added to form a quadripole. The quadripole is designed to be a bandpass filter with a null phase in the passband. An example of parallel resonant circuit is an inductor connected in parallel with a capacitor, a transmission line having open(s) or short(s) stub(s) adequately placed, a crystal resonator, a surface acoustic wave (SAW) circuit, a bulk acoustic wave (BAW) circuit, or a combination of these. Similarly, a series resonant circuit is an inductor mounted in series with a capacitor, a transmission line having open(s) or short(s) stub(s) adequately placed, a crystal resonator, a SAW circuit, a BAW circuit, or a combination of these elements.

The amplifier 2000 resonates at or around the center frequency of the quadripole. When used for FM demodulation, for example, the circuit is adjusted to the center of the quadripole null phase range. Moreover, the maximum frequency deviation that can be demodulated without distortion is equal or larger than the null phase bandwidth, so the bandpass filter quadripole is designed to accommodate the target deviation, whether narrow or wide.

Resistor 2008 and capacitor 2010, when connected to the amplifier input, charge cyclically and as the voltage across resistor 2008 increases, the output current of the amplifier increases. At the same time, the input bias current to the amplifier decreases and at a given threshold switches the amplifier off and quenches the oscillations. At this point the charge accumulated by capacitor 2010 discharges into resistor 2008, and as a consequence, the voltage across resistor 2008 and capacitor 2010 decreases to zero. The cycle restarts, and since the potential across resistor 2008 and capacitor 2010 is low, the amplifier bias current from bias circuit 2014 increases and after a period of time, the oscillations build up again. In one aspect, the bias for the amplifier input may be designed to temperature compensate the amplifier 2000. For instance, if the amplifier 2000 is made from a bipolar transistor, its base to emitter voltage ($V_{BE}$) changes −2 mV/degree. If the DC bias voltage is made to decrease by −2 mV/degree as well, the DC voltage on the emitter remains constant and, therefore, the DC current through the resistor 2008 remains constant.

The signal on line 1522 is the series of second frequency pulses (output repetition frequency), and its shape may resemble the envelope of the first (carrier) frequency present at the output of amplifier 2000. The diode 2012 couples the amplifier 2000 to the RC circuit of resistor 2008 and capacitor 2010 and acts as a low pass filter with good RF behavior. It has a low impedance when in conduction (positive half cycle of the input voltage) and high impedance when in non-conduction (negative half cycle of the input voltage), acting as a rectifier and low pass filter when loaded with an RC circuit. A proper input match to the amplifier on line 1520 via coupling capacitor 2018 may improve performance by a significant factor. Optionally (see FIG. 9), a capacitor may be connected between the cathode of diode 2012 and the input of the amplifier 2000 to increase the coupling and facilitate the repetitive cycling. In other implementations not shown, the diode 2012 can be replaced with an inductor of relatively high value (e.g., ten times the inductance value of the first parallel resonant circuit 2004, 100 nH to 1 mH). In a further additional implementation not shown, diode 2012 can be replaced by an active component such as a transistor that is properly biased.

In common with a Travis discriminator, the LDA demodulator has a "S" curve characteristic output since a low gain amplifier is used that only oscillates if the input and output signals are 180 degrees out of phase. However, with the LDA demodulator, the "S" curve exceeds the quadripole passband bandwidth. In consequence the LDA demodulator doesn't need the automatic frequency control (AFC) required by conventional FM discriminators, as the response doesn't need to sit exactly in the center of the "S" curve. Rather, the LDA demodulator has an auto-centering effect. If the frequency deviation goes high, the repetition rate decreases, and if the frequency deviation goes below or lower in frequency, the repetition goes faster. If the "S" curve is very wide, it can demodulate very wide FM. On the other hand, if the "S" curve is narrow, it can demodulate narrow FM.

The second frequency pulses on line 1522 contain the phase and frequency information and are modulated at a low intermediate frequency by the FM input signal. While standard FM discriminators require a constant amplitude, the LDA demodulator has a large amplitude input dynamic range and that provides an almost constant repetition rate amplitude on line 1522, regardless of whether the input amplitude is large or very small. The baseband signal is recovered by an analog or digital frequency to voltage converter (FVC). The advantages of the LDA demodulator are high sensitivity over a high dynamic range, a constant repetition output amplitude, a high skirt ratio (high selectivity), and a demodulation process that adds several dB in amplitude to the output signal.

The optimal AM or phase demodulation occurs when the input signal frequency is adjusted to the left or right slope of the Bell shape of the LDA response. Moreover, the maximum frequency deviation that can be demodulated with no or little distortion is in the linear slope region, so the resonant quadripole circuit must be designed to accommodate the target deviation, whether narrow or wide. If the output on line 1522 is conditioned with a low pass filter 2016 (shown in phantom) to remove radio frequency (RF) components, an AM, ASK, or OOK modulated signal can be recovered. For AM demodulation, the series resonant circuit 2006 may not be needed. As an alternative, the output or input of the amplifier may also be low pass filtered with filter 2016 to provide a demodulated AM signal. Further, a low pass filter 2016 may be coupled to a node (at the intersection of two series capacitors (not shown)) in the parallel resonant circuit 2004 to provide an AM demodulated signal. Since the low pass filter converts the series of second frequency pulses to a series of voltage levels at the encoded information rate, in some aspects it may be recognized as an FVC circuit.

Figure 21:
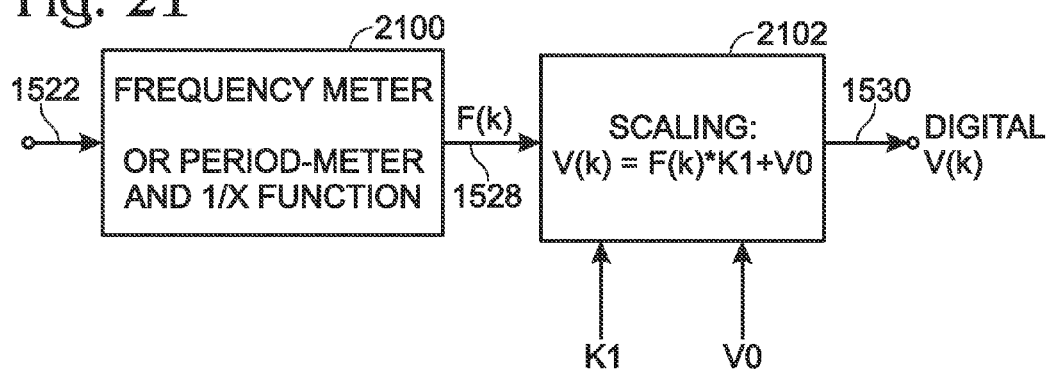
FIG. 21 is a schematic block diagram of a digital FVC circuit and mapping circuit.

FIG. 21 is a schematic block diagram of a digital FVC circuit and mapping circuit. The second frequency pulses on line 1522 can be converted into a digital voltage V(k) by going through an FVC circuit enabled as an instantaneous frequency meter 2100, so that frequencies F(k) of the second frequency pulses on line 1522 can be distinguished and output on line 1528. For example, the instantaneous frequency meter 2100 may use a digital counter to count the frequencies on line 1522 using a clock with a frequency that is at least twice as fast as the frequency to be counted. Thus, if the fastest input period is 1 over 1 kilohertz (KHz) and the desired resolution is 0.1%, then the clock must be at least equal to (1 kHz)/0.1%=1 Mhz. Thus, a binary counter is required with a number of bits≥log$_2$(1 MHz/1 KHz)≥log$_2$(1000)≥10. Alternatively, an instantaneous period meter may be used followed by a digital inverse function. The scaling circuit 2102 supplies the digital voltage V(k) supplied on line 1530 after scaling as follow:

$$V(k)=F(k)*K1+V0, \text{ where:}$$

F(k): kth sample of instantaneous frequency;
K1: a constant in V/Hz;
V0: constant offset voltage that corresponds to the frequency of the voltage generated, such that:

$$V(0)=F(0)*K1.$$

This digital scaling method is required before feeding the digital signal to a mapping function (not shown). Subsequent mapping is especially useful in the case of an n-ary logic signal, as the multi-level voltage signal output by the FVC circuit need not be processed using power consuming parallel analog-to-digital conversions.

Figure 22:
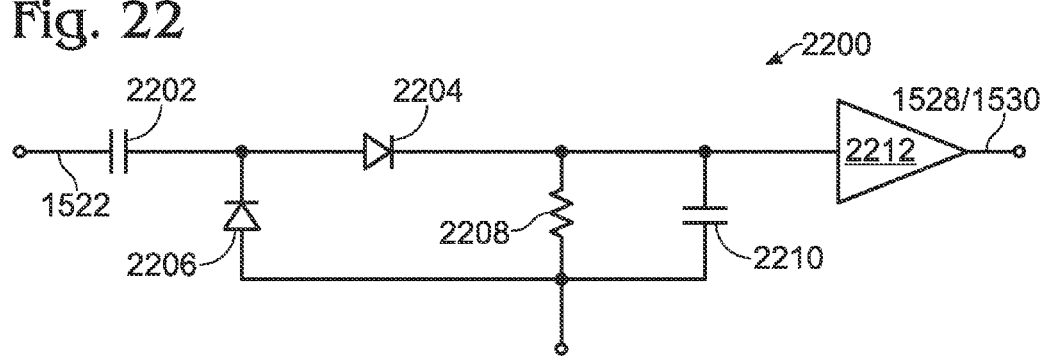
FIG. 22 is a schematic diagram depicting an exemplary analog FVC circuit.

FIG. 22 is a schematic diagram depicting an exemplary analog FVC circuit. The input on line 1522 is the second frequency pulses output of the LDA demodulator. The FVC circuit 2200 comprises a capacitor 2202, diode 2204, diode 2206, resistor 2208, capacitor 2210, and amplifier 2212. The circuit acts to rectify the second frequency pulses on line 1522. The circuit tuning acts to emphasis some frequencies over others, so that the emphasized frequencies create a pulse with an amplitude greater than the deemphasized frequencies. Thus, two or more voltage levels are created at the encoded information rate. If the voltage levels can be clearly distinguished from each other, the circuit may act as both an FVC and mapping circuit. However, further signal conditioning may be performed to create a greater distinction between the voltage levels.

Figure 23:
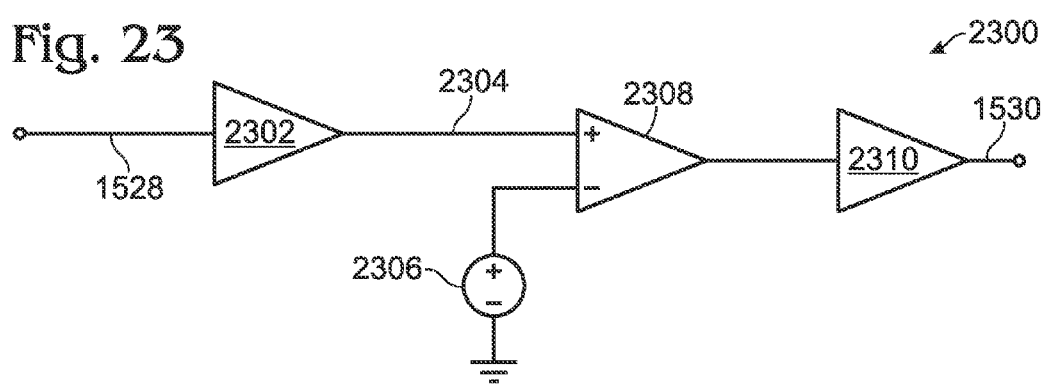
FIG. 23 is a schematic diagram of an exemplary signal conditioning circuit.

FIG. 23 is a schematic diagram of an exemplary signal conditioning circuit. Such a circuit 2300 may be used to condition the output signals supplied by the circuit of FIG. 22.

If the amplitude peak-to-peak for a logical "1" on line 1528 is smaller than desired (e.g. 0.5 Vpp), it can be amplified to create a required digital signal level. For example, if the amplitude of the series of voltage levels on line 1528 is 0.1 Vpp, the required gain may be 5 to 20. The amplification can be done using amplifier 2302, as shown, or in several steps. Thereafter the amplified signal on line 2304 is compared with a reference voltage 2306 at comparator 2308 and is passed when the signal is above the reference voltage. One or more logic gates, one logic gate 2310 is shown, can be added to provide sharp edges and the desired digital voltage amplitude. When used in conjunction with an FVC circuit, circuit 2300 may be understood to be an analog mapping circuit for a binary stream of data.

Figure 24:
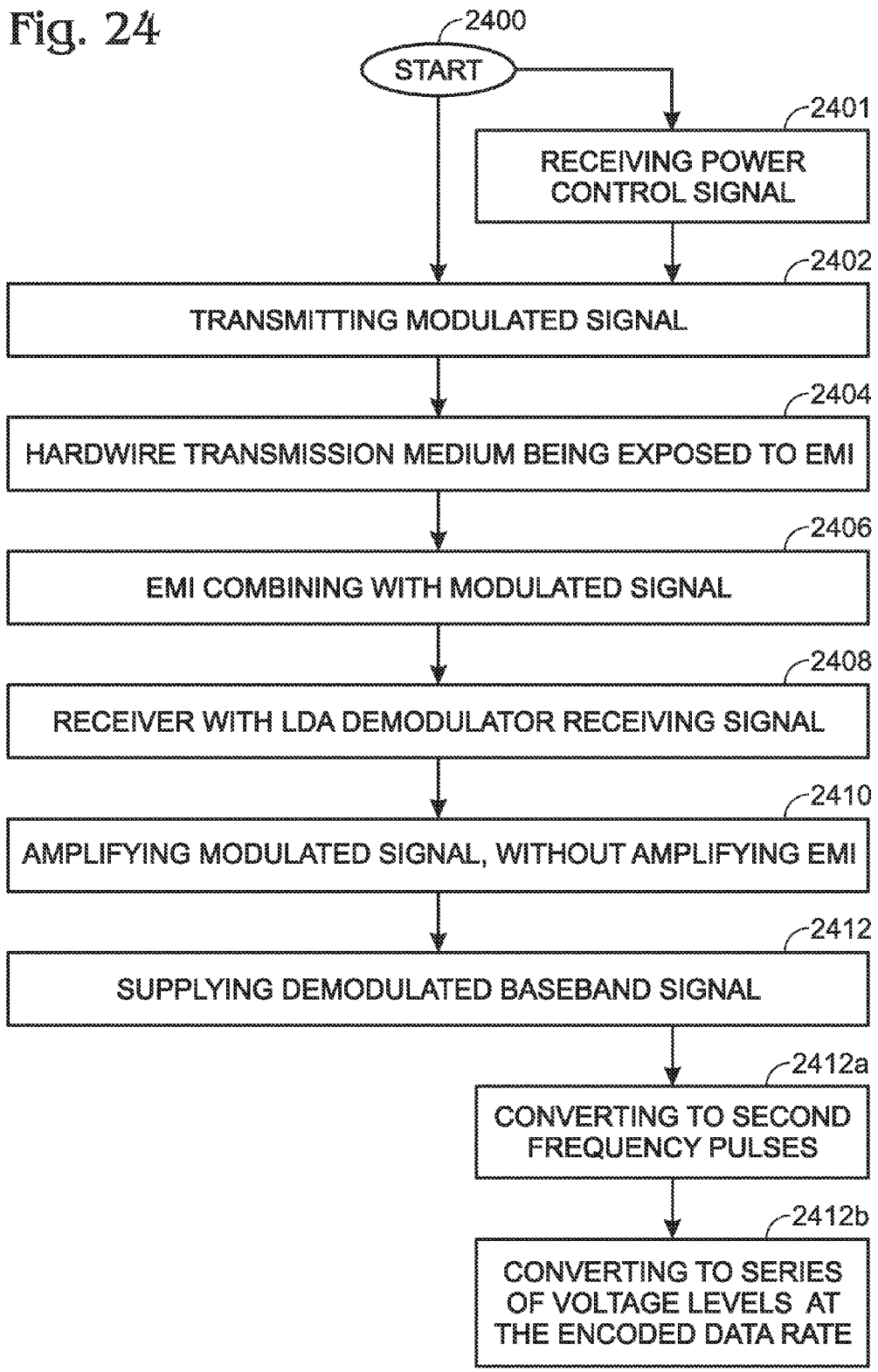
FIG. 24 is a flowchart illustrating a method for communicating signals at a low power level in an EMI environment.

FIG. 24 is a flowchart illustrating a method for communicating signals at a low power level in an EMI environment. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The understanding of the flowchart is supported by the explanations accompanying FIGS. 1 through 23. The method starts at Step 2400.

In Step 2402 a first device transmits a modulated signal having a first carrier frequency, including encoded information, via a hardwire transmission medium. In Step 2404 the hardwire transmission medium is exposed to an environment comprising EMI. For example, the EMI can be Gaussian noise, pink noise, thermal noise, shot noise, 1/f noise, flicker noise, burst noise, transit-time noise, avalanche noise, industrial noise, atmospheric noise, solar noise, cosmic noise, quantification noise, cross-talk noise, electromagnetic interference, fast transition logic signal EMI, the result of a flickering light that generates EMI through sensitive electronic circuit(s), or EMI generated by an oscillator clock.

In Step 2406 the EMI combines with the modulated signal on the hardwire transmission line to create a mixed signal. In Step 2408 a second device including a LDA demodulator circuit receives the mixed signal. In Step 2410 the LDA demodulator circuit amplifies the modulated signal, without amplifying the EMI, and in Step 2412 the LDA demodulator circuit supplies a demodulated baseband signal. In general, Step 2412 supplies an n-ary logic digital signal, an analog signal, or an audio signal.

The LDA demodulator can be contrasted to conventional methods of recovering a weak signal buried in noise such as averaging, selective amplification, filtering, synchronized detection, spread spectrum, and nonlinear RAMAN optic amplifier. With averaging, noise is reduced over several periods. However the signal is not amplified. Also, averaging needs an accurate trigger for reference, and this trigger that may be noisy and problematic at low signal levels. Selective amplification and/or filtering are frequency dependent and stationary, so they don't provide any improvement over time in the frequency pass band, or reduce the noise in that pass band. This is problematic if the bandwidth is large. Also, selective amplifiers have a limited noise rejection.

Synchronized detection requires a phase lock loop (PLL) to lock it to the input signal, which implies a narrow band unless more complicated methods are used, and may also be problematic at very low signal levels. With Direct Sequence Spread Spectrum (DS-SS) the bits are spread over a wide frequency spectrum during the transmitting modulation process, and eventually communicated over a lossy medium. The receiver dispreads energy and makes the demodulated signal appear much higher than the noise floor (e.g. GPS has a typical spreading factor of one thousand). By this means, very high attenuation can be overcome. Of course, this method requires a DS-SS transmitter, which is not practical for many applications. Using a RAMAN distributed optic amplifier, the SNR can be improved and data transported on fiber optic over hundreds or thousands of kilometers with a minimum of regeneration. Again however, the use of such equipment is not practical in most applications.

Transmitting the modulated signal in Step 2402 typically includes the modulated signal being in one of the following formats: frequency modulation (FM), phase modulation (PM), binary frequency shift keying FSK, n-ary frequency shift keying (n-FSK), Gaussian frequency-shift keying (GFSK), n-ary Gaussian frequency-shift keying (n-GFSK), minimum-shift keying (MSK), n-ary minimum-shift keying modulation (n-MSK), Gaussian minimum-shift keying (GMSK), n-ary Gaussian minimum-shift keying (n-GMSK), pulse width modulation (PWM), or amplitude modulation (AM). For example, Step 2402 may transmit a signal modulated to carry a baseband n-ary logic digital signal, where n is an even integer greater than 1. Then, supplying the baseband signal in Step 2412 includes supplying an n-ary logic digital signal. More explicitly, Step 2412 may supply a single data stream of n logic levels or $\log_2$ (n) binary logic data streams. In another example, Step 2402 transmits an n-FSK modulated FM signal, and Step 2412 supplies $\log_2$ (n) streams of baseband binary logic digital signals.

In one aspect, transmitting the modulated signal via the hardwire transmission medium in Step 2404 includes transmitting via a hardwire transmission medium that may be a single-ended or differential signal media, such as a PCB metal trace, conductive ink, conductive semiconductor trace, conductive polymer trace, bad conductor trace, meta-metal conductor, conductive trace, nanotube conductor, wire, wire twisted-pair, wire double twisted pair, wire quadruple twisted pair, DSL line, Ethernet line, connector, wire harness, microstrip, waveguide, fiber optic cable, power line, coaxial cable, or stripline medium. In another aspect, supplying the demodulated baseband signal in Step 2412 includes substeps. Step 2412*a* converts the modulated signal to a series of second frequency pulses having a rate of change at least twice that of the encoded information rate, also referred to herein as the repetition frequency signal, pseudo-digital pulse-modulated signal, or f_rep. Step 2412*b* converts the series of second frequency pulses to a series of voltage levels at the encoded information rate. As noted above, for example in the explanation of FIGS. 21-23, in some aspects Step 2412*b* may perform a mapping function, mapping the series of voltage levels into an n-ary logic digital signal. In a different aspect, the first device receives a power control signal in Step 2401. Then, transmitting the modulated signal in Step 2402 includes the first device transmitting the modulated signal at a power level responsive to the control signal.

FIG. 25 is a flowchart illustrating a method for communicating signals at low power levels. The method begins at Step 2500. At a first time in Step 2502, a first device transmits a baseband signal with encoded information via a first hardwire transmission medium. At the first time in Step 2504, a second device successfully receives the baseband signal when it is transmitted at a minimally sufficient first power level, or greater. At a second time in Step 2506, the first device modulates the baseband signal, creating a modulated signal having a first carrier frequency, including the encoded information. Generally, the first device modulates a baseband signal that is an n-ary logic digital signal or an audio frequency signal. However, the baseband signal may be digital or analog, and it not limited to any particular frequency range. At the second time in Step 2508, the first device transmits the modulated signal, via the first hardwire first transmission medium, to the second device at a second power level, less that the first power level. At the second time in Step 2510, the second device uses an LDA demodulator circuit to successfully convert the modulated signal to the baseband signal.

In one aspect, the first device transmitting the baseband signal at the first time in Step 2502 includes transmitting the baseband binary logic digital signals via $\log_2$ (n) hardwire transmission media, where n is an even integer greater than 1. Then, the first device modulating the baseband signal at the second time in Step 2506 includes modulating an n-ary logic digital signal, creating an n-ary modulated signal. Transmitting the modulated signal at the second time in Step 2508 includes transmitting the n-ary modulated signal via only the first hardline transmission medium, and the second device successfully converts the n-ary modulated signal to the n-ary logic digital signal in Step 2510.

In one aspect, transmitting the modulated signal via the first hardwire transmission medium at the second time in Step 2508 includes transmitting via a hardware transmission medium that is either a single-ended or differential signal media, such as a PCB metal trace, conductive ink, conductive semiconductor trace, conductive polymer trace, bad conductor trace, meta-metal conductor, conductive trace, nanotube conductor, wire, wire twisted-pair, wire double twisted pair, wire quadruple twisted pair, DSL line, Ethernet line, connector, wire harness, microstrip, waveguide, fiber optic cable, power line, coaxial cable, or stripline medium.

In another aspect subsequent to the second time, in Step 2512 the first device receives a power control signal. At a third time in Step 2514 the first device transmits the modulated signal at a third power level less that the second power level in response to receiving the power control signal. Then at the third time in Step 2516 the second device successfully converts the modulated signal to the baseband signal.

System and methods have been provided for communicating baseband information at low power levels in an EMI environment. Examples of particular circuit topologies, hardware units, and process steps have been presented to illustrate the invention. However, the invention is not limited to merely these examples. Other variations and embodiments of the invention will occur to those skilled in the art.

We claim:

1. A low-power, noise insensitive communication channel comprising:
    a first device comprising:
        a first modulator having an input to accept a baseband signal with encoded information, and an output to supply a modulated signal having a first carrier frequency, including the encoded information;
        a first interface connected to a hardwire transmission medium to supply the modulated signal;
    a second device comprising:
        a second interface connected to the hardline transmission medium;
        a first logarithmic detector amplifier (LDA) demodulator circuit having an input connected to the second interface, and an output to supply the baseband signal with the encoded information; and,
    wherein the LDA demodulator circuit comprises a frequency-to-voltage converter (FVC) to accept a series of second frequency pulses having a rate of change at least twice that of an encoded information rate, and converts the series of second frequency pulses to a series of voltage levels at the encoded information rate.

2. The communication channel of claim 1 wherein the first modulator accepts a baseband signal selected from a group consisting of an n-ary logic digital signal, a digital-to-analog converted signal, an analog signal, and an audio signal.

3. The communication channel of claim 1 wherein the first modulator is a voltage controlled oscillator (VCO) accepting an n-ary logic digital signal, and supplying an n-frequency shift keying (n-FSK) modulated FM signal; and,
    wherein the first LDA demodulator circuit supplies the n-ary logic digital signal.

4. The communication channel of claim wherein, the first device further comprises:
    a second LDA demodulator circuit having an input and an output; and,
    a first switch having an input connected to the first interface, a first switch position connected to the input of the second LDA demodulator circuit, a second switch position connected to the first modulator output, and a control input to accept a first control signal selectively connecting the first switch input to a switch position.

5. The communication channel of claim 4 wherein, the second device further comprises:
    a second modulator having an input and an output; and,
    a second switch having an input connected to the second interface, a first switch position connected to the input of the first LDA demodulator circuit, a second switch position connected to the second modulator output, and a control input to accept a second control, signal selectively connecting the second switch input to a switch position.

6. The communication channel of claim wherein the first modulator is an LDA-VCO comprising:
    an amplifier having an input and an output;
    a capacitor connected between the amplifier input and output;
    a variable direct current (DC) bias source connected to the amplifier input, responsive to the baseband signal;
    a first parallel resonant circuit connected between the amplifier output and a reference voltage, having a resonance at the first frequency; and,
    wherein the amplifier output supplies a signal centered at the first frequency and modulated in response to the variable bias source.

7. The communication channel of claim wherein the modulator is an LDA-VCO further comprising:
    an amplifier having an input and an output;
    a capacitor connected between the amplifier input and output;
    a DC bias source connected to the amplifier input;
    a first parallel resonant circuit connected between the amplifier output and a reference voltage, having a resonance at the first frequency;
    a varicap connected in parallel with the first parallel resonant circuit, to accept a variable tuning voltage responsive to the baseband signal; and,
    wherein the amplifier output supplies a signal centered at the first frequency and modulated in response to the variable tuning voltage.

8. The communication channel of claim 1 wherein the first modulator supplies the modulated signal in a format selected from a group consisting of frequency modulation (FM), phase modulation (PM), binary frequency shift keying FSK, n-ary frequency shift keying (n-FSK), Gaussian frequency-shift keying (GFSK), n-ary Gaussian frequency-shift keying (n-GFSK), minimum-shift keying (MSK), n-ary minimum-shift keying modulation (n-MSK), Gaussian minimum-shift keying (GMSK), n-ary Gaussian minimum-shift keying (n-GMSK), pulse width modulation (PWM), and amplitude modulation (AM).

9. The communication channel of claim 1 wherein the transmission medium is selected from a group consisting of single-ended and differential signal media, a printer circuit board (PCB) metal trace, conductive ink, conductive semiconductor trace, conductive polymer trace, bad conductor trace, meta-metal conductor, conductive trace, nanotube conductor, wire, wire twisted-pair, wire double twisted pair, wire quadruple twisted pair, DSL line, Ethernet line, connector, wire harness, microstrip, waveguide, fiber optic cable, power line, coaxial cable, and stripline.

10. The communication channel of claim 1 wherein the first modulator has a power control port to receive a variable power level control signal, and wherein the first modulator supplies the modulated signal at a power level responsive to the power level control signal.

11. A method for communicating signals at a low power level in an electromagnetic interference (EMI) environment, the method comprising:
a first device transmitting a modulated signal having a first carrier frequency, including encoded information, via a hardwire transmission medium;
the hardwire transmission medium being exposed to an environment comprising EMI;
the EMI combining with the modulated signal on the hardwire transmission line to create a mixed signal;
a second device including a logarithmic detector amplifier (LDA) demodulator circuit receiving the mixed signal;
the LDA demodulator circuit amplifying the modulated signal, without amplifying the EMI;
the LDA demodulator circuit supplying a demodulated baseband signal as follows:
converting the modulated signal to a series of second frequency pulses having a rate of change at least twice that of an encoded information rate; and,
converting the series of second frequency pulses to a series of voltage levels at the encoded information rate.

12. The method of claim 11 wherein the EMI is selected from a group consisting of Gaussian noise, pink noise, thermal noise, shot noise, 1/f noise, flicker noise, burst noise, transit-time noise, avalanche noise, industrial noise, atmospheric noise, solar noise, cosmic noise, quantification noise, cross-talk noise, electromagnetic interference, one or more fast transition logic signal(s) EMI, EMI generated as a result of flickering light in a sensitive electronic circuit, and EMI generated by an oscillator clock.

13. The method of claim 11 wherein transmitting the modulated signal includes the modulated signal being in a format selected from a group consisting of frequency modulation (FM), phase modulation (PM), binary frequency shift keying FSK, n-ary frequency shift keying (n-FSK), Gaussian frequency-shift keying (GFSK), n-ary Gaussian frequency-shift keying (n-GFSK), minimum-shift keying (MSK), n-ary minimum-shift keying modulation (n-MSK), Gaussian minimum-shift keying (GMSK), n-ary Gaussian minimum-shift keying (n-GMSK), pulse width modulation (PWM), and amplitude modulation (AM).

14. The method of claim 11 wherein transmitting the modulated signal includes transmitting a signal modulated to carry a baseband n-ary logic digital signal; and,
wherein supplying the baseband signal includes supplying the baseband n-ary logic digital signal.

15. The method of claim 11 wherein the transmitting the modulated signal includes transmitting an n-frequency shift keying (n-FSK) modulated FM signal; and,
wherein supplying the baseband signal includes supplying $\log_2 (n)$ streams of baseband binary logic digital signals.

16. The method of claim 11 wherein transmitting the modulated signal via the hardwire transmission medium includes transmitting via a hardwire transmission medium selected from a group consisting of single-ended and differential signal media, a printer circuit board (PCB) metal trace, wire, wire twisted-pair, conductive ink, conductive semiconductor trace, conductive polymer trace, bad conductor trace, meta-metal conductor, conductive trace, nanotube conductor, wire double twisted pair, wire quadruple twisted pair, DSL line, Ethernet line, connector, wire harness, microstrip, waveguide, fiber optic cable, power line, coaxial cable, and stripline.

17. The method of claim 11 wherein supplying the baseband signal includes supplying a baseband signal selected from a group consisting of an n-ary logic digital signal, an analog signal, and an audio signal.

18. The method of claim 11 further comprising:
the first device receiving a power control signal; and,
wherein the first device transmitting the modulated signal includes the first device transmitting the modulated signal at a power level responsive to the control signal.

19. A method for communicating signals at low power levels, the method comprising:
at a first time, a first device transmitting a baseband signal with encoded information via a first hardwire transmission medium;
at the first time, a second device successfully receiving the baseband signal when it is transmitted at a minimally sufficient first power level, or greater;
at a second time, the first device modulating the baseband signal, creating a modulated signal having a first carrier frequency, including the encoded information;
at the second time, the first device transmitting the modulated signal, via the hardware first transmission medium, to the second device at a second power level, less than the first power level; and,
at the second time, the second device using a logarithmic detector amplifier (LDA) demodulator circuit to successfully convert the modulated signal to the baseband signal.

20. The method of claim 19 wherein the first device transmitting the baseband signal at the first time includes transmitting baseband binary logic digital signals via $\log_2 (n)$ hardwire transmission media, where n is an even integer greater than 1;
wherein the first device modulating the baseband signal at the second time includes modulating an n-ary logic digital signal, creating an n-ary modulated signal;
wherein transmitting the modulated signal at the second time includes transmitting the n-ary modulated signal via only the first hardline transmission medium; and,
wherein the second device successfully converting the modulated signal to the baseband signal at the second time includes converting the n-ary modulated signal to the n-ary logic digital signal.

21. The method of claim 19 wherein the first device modulating the baseband signal at the second time includes the first device modulating a baseband signal selected from a group consisting of an n-ary logic digital signal, a digital-to-analog converted signal, an analog signal, and an audio signal.

22. The method of claim 19 wherein transmitting the modulated signal via the first hardwire transmission medium at the second time includes transmitting via a hardwire transmission medium selected from a group consisting of single-ended and differential signal media, a printer circuit board (PCB) metal trace, conductive ink, conductive semiconductor trace, conductive polymer trace, bad conductor trace, metametal conductor, conductive trace, nanotube conductor, wire, wire twisted-pair, wire double twisted pair, wire quadruple twisted pair, DSL line, Ethernet line, connector, wire harness, microstrip, waveguide, fiber optic cable, power line, coaxial cable, and stripline.

23. The method of claim 19 further comprising:
subsequent to the second time, the first device receiving a power control signal;
at a third time, the first device transmitting the modulated signal at a third power level less than the second power level in response to receiving the power control signal; and,
at the third time, the second device successfully converting the modulated signal to the baseband signal.

24. A low-power, noise insensitive communication channel comprising:
a first device comprising:
a first modulator having an input to accept a baseband signal with encoded information, and an output to supply a modulated signal having a first carrier frequency, including the encoded information;
a first interface connected to a hardwire transmission medium to supply the modulated signal;
a second device comprising:
a second interface connected to the hardline transmission medium;
a first logarithmic detector amplifier (LDA) demodulator circuit having an input connected to the second interface, and an output to supply the baseband signal with the encoded information; and,
wherein the first modulator is a voltage controlled oscillator (VCO) accepting an n-ary logic digital signal, and supplying an n-frequency shift keying (n-FSK) modulated FM signal; and,
wherein the first LDA demodulator circuit supplies the n-ary logic digital signal.

25. A low-power, noise insensitive communication channel comprising:
a first device comprising:
a first modulator having an input to accept a baseband signal with encoded information, and an output to supply a modulated signal having a first carrier frequency, including the encoded information;
a first interface connected to a hardwire transmission medium to supply the modulated signal;
a second device comprising:
a second interface connected to the hardline transmission medium;
a first logarithmic detector amplifier (LDA) demodulator circuit having an input connected to the second interface, and an output to supply the baseband signal with the encoded information; and,
wherein the first device further comprises:
a second LDA demodulator circuit having an input and an output; and,
a first switch having an input connected to the first interface, a first switch position connected to the input of the second LDA demodulator circuit, a second switch position connected to the first modulator output, and a control input to accept a first control signal selectively connecting the first switch input to a switch position.

26. The communication channel of claim 25 wherein the second device further comprises:
a second modulator having an input and an output; and,
a second switch having an input connected to the second interface, a first switch position connected to the input of the first LDA demodulator circuit, a second switch position connected to the second modulator output, and a control input to accept a second control signal selectively connecting the second switch input to a switch position.

27. A low-power, noise insensitive communication channel comprising:
a first device comprising;
a first modulator having an input to accept a baseband signal with encoded information, and an output to supply a modulated signal having a first carrier frequency, including the encoded information;
a first interface connected to a hardwire transmission medium to supply the modulated signal;
a second device comprising:
a second interface connected to the hardline transmission medium;
a first logarithmic detector amplifier (LDA) demodulator circuit having an input connected to the second interface, and an output to supply the baseband signal with the encoded information; and,
wherein the first modulator is an LDA-VCO comprising:
an amplifier having an input and an output;
a capacitor connected between the amplifier input and output;
a variable direct current (DC) bias source connected to the amplifier input, responsive to the baseband signal;
a first parallel resonant circuit connected between the amplifier output and a reference voltage, having a resonance at the first frequency; and,
wherein the amplifier output supplies a signal centered at the first frequency and modulated in response to the variable bias source.

28. A low-power, noise insensitive communication channel comprising:
a first device comprising:
a first modulator having an input to accept a baseband signal with encoded information, and an output to supply a modulated signal having a first carrier frequency, including the encoded information;
a first interface connected to a hardwire transmission medium to supply the modulated signal;
a second device comprising:
a second interface connected to the hardline transmission medium;
a first logarithmic detector amplifier (LDA) demodulator circuit having an input connected to the second interface, and an output to supply the baseband signal with the encoded information;
wherein the modulator is an LDA-VCO further comprising:
an amplifier having an input and an output;
a capacitor connected between the amplifier input and output;
a DC bias source connected to the amplifier input;
a first parallel resonant circuit connected between the amplifier output and a reference voltage, having a resonance at the first frequency;
a varicap connected in parallel with the first parallel resonant circuit, to accept a variable tuning voltage responsive to the baseband signal; and, wherein the amplifier output supplies a signal centered at the first frequency and modulated in response to the variable tuning voltage.

29. A method for communicating signals at a low power level in an electromagnetic interference (EMI) environment, the method comprising:
- a first device transmitting an n-frequency shift keying (n-FSK) modulated FM signal having a first carrier frequency, including encoded information, via a hardwire transmission medium;
- the hardwire transmission medium being exposed to an environment comprising EMI;
- the EMI combining with the modulated signal on the hardwire transmission line to create a mixed signal;
- a second device including a logarithmic detector amplifier (LDA) demodulator circuit receiving the mixed signal;
- the LDA demodulator circuit amplifying the modulated signal, without amplifying the EMI; and,
- the LDA demodulator circuit supplying a demodulated baseband signal including $\log_2 (n)$ streams of baseband binary logic digital signals.

* * * * *

UNITED STATES PATENT AND TRADEMARK OFFICE
CERTIFICATE OF CORRECTION

| | | |
|---|---|---|
| PATENT NO. | : 9,048,943 B2 | Page 1 of 1 |
| APPLICATION NO. | : 14/210525 | |
| DATED | : June 2, 2015 | |
| INVENTOR(S) | : Patrick Rada et al. | |

It is certified that error appears in the above-identified patent and that said Letters Patent is hereby corrected as shown below:

In the Claims,

In Column 24, at line 11, the preamble of claim 4 fails to list the claim from which it is dependent. The preamble should read as follows:

4. The communication channel of claim 1 .....

In Column 24, at line 32, the preamble of claim 6 fails to list the claim from which it is dependent. The preamble should read as follows:

6. The communication channel of claim 1 .....

In Column 24, at line 45, the preamble of claim 7 fails to list the claim from which it is dependent. The preamble should read as follows:

7. The communication channel of claim 1 .....

Signed and Sealed this
Twenty-ninth Day of September, 2015

Michelle K. Lee
*Director of the United States Patent and Trademark Office*